United States Patent
Yokoyama et al.

(10) Patent No.: US 11,186,921 B2
(45) Date of Patent: Nov. 30, 2021

(54) METHOD FOR CONTROLLING CONVECTION PATTERN OF SILICON MELT AND METHOD FOR PRODUCING MONOCRYSTALLINE SILICON

(71) Applicant: SUMCO CORPORATION, Tokyo (JP)

(72) Inventors: Ryusuke Yokoyama, Tokyo (JP); Wataru Sugimura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/975,884

(22) PCT Filed: Feb. 27, 2019

(86) PCT No.: PCT/JP2019/007443
§ 371 (c)(1),
(2) Date: Aug. 26, 2020

(87) PCT Pub. No.: WO2020/174598
PCT Pub. Date: Sep. 3, 2020

(65) Prior Publication Data
US 2021/0140066 A1    May 13, 2021

(51) Int. Cl.
*C30B 15/20* (2006.01)
*C30B 29/06* (2006.01)
*C30B 30/04* (2006.01)

(52) U.S. Cl.
CPC ............ *C30B 15/203* (2013.01); *C30B 29/06* (2013.01); *C30B 30/04* (2013.01)

(58) Field of Classification Search
CPC ....... C30B 15/203; C30B 15/20; C30B 15/22; C30B 30/04; C30B 29/06
See application file for complete search history.

(56) References Cited

U.S. PATENT DOCUMENTS 6,423,285 B1 * 7/2002 Itoi ................... C30B 15/305
423/328.2
10,858,753 B2 * 12/2020 Sugimura ............ C30B 29/06
(Continued)

FOREIGN PATENT DOCUMENTS

CN     1904147        6/2011
CN     108291327 A    7/2018
(Continued)

OTHER PUBLICATIONS

Official Communication issued in International Bureau of WIPO Patent Application No. PCT/JP2019/007443, dated Jun. 4, 2019.
(Continued)

*Primary Examiner* — Robert M Kunemund
(74) *Attorney, Agent, or Firm* — Greenblum & Bernstein, P.L.C.

(57) ABSTRACT

A method of controlling a convection pattern of a silicon melt includes: acquiring a temperature at a first measurement point not overlapping a rotation center of a quartz crucible on a surface of the silicon melt, the quartz crucible rotating in a magnetic-field-free state; determining that the temperature at the first measurement point periodically changes; and fixing a direction of a convection flow to a single direction in a plane orthogonal with an application direction of a horizontal magnetic field in the silicon melt by starting a drive of a magnetic-field applying portion to apply the horizontal magnetic field to the silicon melt when a temperature change at the first measurement point reaches a predetermined state, and subsequently raising the intensity to 0.2 tesla or more.

8 Claims, 13 Drawing Sheets

(56) References Cited

U.S. PATENT DOCUMENTS

2005/0263062 A1      12/2005  Hoshi et al.
2010/0126409 A1*      5/2010  Sakurada .............. C30B 15/305
                                                                    117/32
2020/0165742 A1*      5/2020  Sugimura ............... C30B 30/04

FOREIGN PATENT DOCUMENTS

| JP | 2003-327491 | 11/2003 |
| TW | 463224 | 11/2001 |
| WO | 2017/077701 | 5/2017 |
| WO | 2018/088633 | 5/2018 |

OTHER PUBLICATIONS

Office Action issued in Taiwan Counterpart Patent Appl. No. 108115021, dated Apr. 14, 2020, along with an English translation thereof.
Office Action for CN App. No. 201980015952.1, dated Jul. 20, 2021 (w/ translation).

* cited by examiner

METHOD FOR CONTROLLING CONVECTION PATTERN OF SILICON MELT AND METHOD FOR PRODUCING MONOCRYSTALLINE SILICON

TECHNICAL FIELD

The present invention relates to a method of controlling a convection pattern of a silicon melt and a manufacturing method of monocrystalline silicon.

BACKGROUND ART

A method called Czochralski method (hereinafter, referred to as CZ method) is used for manufacturing monocrystalline silicon. In such a manufacturing method using the CZ method, various studies have been made for controlling oxygen concentration of monocrystalline silicon (see, for instance, Patent Literature 1).

Patent Literature 1 discloses that the oxygen concentration of monocrystalline silicon can be controlled by pulling up a seed crystal dipped into a silicon melt while the silicon melt flows from one side to the other side in a plane including a pull-up axis of the seed crystal and parallel to an application direction of a magnetic field.

CITATION LIST

Patent Literature(S)

Patent Literature 1 WO 2017/077701 A

SUMMARY OF THE INVENTION

Problem(s) to be Solved by the Invention

However, the oxygen concentration sometimes varies in each monocrystalline silicon even when such a method as that of Patent Literature 1 is employed.

An object of the invention is to provide a convection pattern control method of a silicon melt for restraining a variation in an oxygen concentration of each monocrystalline silicon, and a manufacturing method of monocrystalline silicon.

Means for Solving the Problem(s)

A method of controlling a convection pattern of a silicon melt according to an aspect of the invention is used for manufacturing monocrystalline silicon, the method including: acquiring a temperature at a first measurement point on a surface of a silicon melt in a quartz crucible rotating in a magnetic-field-free state, the first measurement point not overlapping a rotation center of the quartz crucible; determining that the temperature at the first measurement point is periodically changed; and at a timing when a temperature change at the first measurement point reaches a predetermined state, starting a drive of the magnetic-field applying portion to apply a horizontal magnetic field to the silicon melt, and subsequently raising the intensity to 0.2 tesla or more to fix a direction of a convection flow in a plane orthogonal to an application direction of the horizontal magnetic field in the silicon melt to a single direction.

A downward flow, which once rises from an outer part of the silicon melt and then flows downward at a central part of the silicon melt, is generated in the silicon melt in a magnetic-field-free state (i.e. without being applied with the horizontal magnetic field). When the quartz crucible is rotated in this state, the downward flow is shifted to a position offset from the rotation center and rotates in a rotation direction of the quartz crucible as viewed from above the quartz crucible. When the horizontal magnetic field whose intensity is 0.01 tesla is applied in this state, the rotation of the downward flow as viewed from above is restrained. Subsequently, when a magnetic field intensity is increased, a magnitude of the convection flow in a rising direction changes on the right side and the left side of the downward flow in a plane (a plane orthogonal to the direction in which the horizontal magnetic field is applied (hereinafter, referred to as a "field-orthogonal cross-section")) in the silicon melt as viewed in a negative direction of a Y axis (in a right-handed XYZ Cartesian coordinate system that defines a center of the silicon melt as an origin, an upward direction as a positive direction of a Z axis, and a direction to which the horizontal magnetic field is applied as a positive direction of the Y axis). When the magnetic field intensity reaches 0.2 tesla, on any side with respect to the application direction in the silicon melt, one of the convection flows disappears and only a clockwise or anticlockwise convection flow remains. When the convection flow is fixed clockwise in the field-orthogonal cross-section, the temperature of the silicon melt becomes higher on the left side than on the right side. When the convection flow is fixed anticlockwise, the temperature of the silicon melt becomes higher on the right side than on the left side.

Since the pull-up device of monocrystalline silicon, which is symmetrically designed, is not strictly symmetric with regard to the components thereof, a thermal environment in the chamber is also not symmetric.

For instance, when the convection flow is fixed clockwise in a pull-up device having such a thermal environment that the quartz crucible has a higher temperature on the left side than on the right side in the field-orthogonal cross-section, since the left side of the silicon melt in the clockwise convection flow becomes higher in temperature, the temperature on the left side of the silicon melt becomes higher in synergy with the thermal environment. In contrast, when the convection flow is fixed anticlockwise, the synergistic effect with the thermal environment as in the clockwise convection flow does not occur and the left side of the silicon melt does not become so high in temperature.

Since an amount of oxygen eluted from the quartz crucible is increased as the temperature of the silicon melt becomes higher, when the pull-up device having the above-described thermal environment is used for pulling up the monocrystalline silicon, the amount of oxygen caught in the monocrystalline silicon when the convection flow is fixed clockwise is increased to raise the oxygen concentration in the straight body with respect to the convection flow that is fixed anticlockwise.

The downward flow is generated by a temperature distribution in which the temperature at a part of the surface of the silicon melt corresponding to the downward flow is the lowest and the temperature gradually increases toward an outer part of the surface. Accordingly, the temperature at a first measurement point in the silicon melt in the rotating quartz crucible periodically changes in response to the rotation of the downward flow. The direction of convection flow of the silicon melt at the time of applying the horizontal magnetic field is determined by the position of the downward flow in the rotation direction as viewed from above and an application timing of the horizontal magnetic field.

According to the above aspect of the invention, the horizontal magnetic field of 0.01 tesla, which is applied at the timing when a temperature change at the first measurement point of the silicon melt reaches a predetermined state (i.e. when the position of the downward flow in the rotation direction as viewed from above reaches a predetermined point), is subsequently raised to 0.2 tesla or more, thus always fixing the direction of the convection flow in a constant direction irrespective of symmetry or asymmetry of the structure of the pull-up device. Accordingly, the variation in the oxygen concentration in each monocrystalline silicon can be reduced by fixing the direction of the convection flow as described above.

In the method according to the above aspect of the invention, it is preferable that the first measurement point is located at a position for a central part of a downward flow to pass through on the surface of the silicon melt rotating in the same direction as a rotation of the quartz crucible.

According to the above arrangement, the change in the temperature of the surface of the silicon melt can be more accurately determined by measuring the position on the surface of the silicon melt at which the central part of the downward flow passes (i.e. a position with the lowest temperature), so that the direction of the convection flow can be more accurately fixed.

In the method according to the above aspect of the invention, it is preferable that the timing for the temperature change at the first measurement point to reach the predetermined state is a first timing where the central part of the downward flow on the surface of the silicon melt is in a region of X>0 or a second timing where the central part of the downward flow on the surface of the silicon melt is in a region of X<0, the X being defined as an X axis in a right-handed XYZ orthogonal coordinate system whose origin is defined by a center of the surface of the silicon melt, a positive direction of a Z axis is defined by a vertically upward direction, and a positive direction of a Y axis is defined by the application direction of the horizontal magnetic field, and in the fixing of the direction of the convection flow to the single direction, as viewed in a negative direction of the Y axis, the direction of the convection flow is fixed clockwise when the timing for the temperature change reaches the predetermined state is the first timing, and the direction of the convection flow is fixed anticlockwise when the timing for the temperature change reaches the predetermined state is the second timing.

According to the above arrangement, the horizontal magnetic field of 0.01 tesla is applied at the first timing or the second timing to fix the direction of the convection flow in a desired single direction.

In the method according to the above aspect of the invention, it is preferable that in the fixing of the direction of the convection flow in the single direction, the magnetic-field applying portion configured to apply the horizontal magnetic field is started being driven at a time $t_\alpha$ satisfying a formula (2) below after the temperature change at the first measurement point reaches a state represented by a periodic function represented by a formula (1) below, where:

T(t) represents a temperature at the first measurement point at a time t;

$\omega$ represents an angular frequency;

A represents an amplitude of a vibration;

B represents a phase of the vibration when the time t is 0;

C represents a term representing a component other than the vibration;

n represents an integer;

$\theta$, which is defined in a right-handed XYZ orthogonal coordinate system whose origin is defined by a center of the surface of the silicon melt, a positive direction of a Z axis is defined by a vertically upward direction, and a positive direction of a Y axis is defined by the application direction of the horizontal magnetic field, represents a positive angle defined by a first imaginary line and a second imaginary line, the first imaginary line being defined by a line extending from the origin in a positive direction of an X axis, the second imaginary line being defined by a line passing through the origin and the first measurement point, the positive angle being defined by an angle in a rotation direction of the quartz crucible; and H represents an increase rate (tesla/second) of the intensity of the horizontal magnetic field at the start of applying the horizontal magnetic field, Numerical Formula 1

$$T(t)=A\sin(\omega t+B)+C \quad (1)$$

Numerical Formula 2

$$\frac{1}{\omega}\{2n\pi - B - \theta\} - \frac{0.01}{H} < t_\alpha < \frac{1}{\omega}\{(2n+1)\pi - B - \theta\} - \frac{0.01}{H} \quad (2)$$

According to the above arrangement, based on the formula (2), which takes the time elapsed after starting the application of the horizontal magnetic field until the 0.01 tesla magnetic field is applied to the silicon melt into account, the direction of the convection flow can be more accurately fixed.

In the method according to the above aspect of the invention, it is preferable that, in the acquiring of the temperature at the first measurement point, a temperature of a second measurement point on a chamber of a pull-up device or a component disposed in the chamber is measured with a thermometer, based on measurement results of which the temperature at the first measurement point is estimated.

According to the above arrangement, the direction of the convection flow can be fixed also by estimating the temperature at the first measurement point of the silicon melt based on the temperature at the second measurement point on the chamber or the component installed in the chamber.

In the method according to the above aspect of the invention, it is preferable that, in the fixing of the direction of the convection flow in the single direction, the magnetic-field applying portion configured to apply the horizontal magnetic field is started being driven at a time $t_\beta$ satisfying a formula (4) below after the temperature change at the second measurement point reaches a state represented by a periodic function represented by a formula (3) below, where:

T(t) represents a temperature at the second measurement point at a time t;

$\omega$ represents an angular frequency;

A represents an amplitude of a vibration;

B represents a phase of the vibration when the time t is 0;

C represents a term representing a component other than the vibration;

n represents an integer;

$\theta$, which is defined in the right-handed XYZ orthogonal coordinate system where the origin is defined by the center of the surface of the silicon melt, the positive direction of the Z axis is defined by the vertically upward direction, and the positive direction of the Y axis is defined by the application direction of the horizontal magnetic field, represents a positive angle defined by a first imaginary line and a second imaginary line, the first imaginary line being defined by a line extending from the origin in the positive direction of the X axis, the second imaginary line being defined by a line passing through the origin and the second measurement point, the positive angle being defined by an angle in a rotation direction of the quartz crucible;

H represents an increase rate (tesla/second) of the intensity of the horizontal magnetic field at the start of applying the horizontal magnetic field, and $T_{ex}$: represents a time elapsed for the temperature change at the first measurement point located on the second imaginary line to be reflected on the temperature change at the second measurement point, Numerical Formula 3

$$T(t)=A \sin(\theta t+B)+C \qquad (3)$$

Numerical Formula 4

$$\frac{1}{\omega}\{2n\pi - B - \theta\} - \frac{0.01}{H} - T_{ex} < t_\beta < \frac{1}{\omega}\{(2n+1)\pi - B - \theta\} - \frac{0.01}{H} - T_{ex} \qquad (4)$$

According to the above arrangement, based on the formula (4), which takes into account the time elapsed after starting the application of the horizontal magnetic field until the 0.01 tesla magnetic field is applied to the silicon melt and the time elapsed for the temperature change at the first measurement point to be reflected to the temperature change at the second measurement point, the direction of the convection flow can be more accurately fixed.

A manufacturing method of monocrystalline silicon according to another aspect of the invention includes: conducting the method of controlling the convection pattern of the silicon melt according to above-described aspect; and pulling up the monocrystalline silicon while the intensity of the horizontal magnetic field is kept at 0.2 tesla or more.

In the manufacturing method of monocrystalline silicon according to the above aspect of the invention, it is preferable that the monocrystalline silicon is pulled up after conducting the method of controlling the convection pattern of the silicon melt and confirming that the direction of the convection flow is fixed.

According to the above arrangement, a phenomenon, in which crystal quality and actions during the pull-up process are divided in two groups even when the monocrystalline silicon is pulled up with the same pull-up device and under the same manufacture conditions, can be prevented.

BRIEF DESCRIPTION OF DRAWING(S)

FIG. 1 schematically shows an arrangement of a pull-up device according to a first exemplary embodiment of the invention.

FIG. 2 schematically shows how a horizontal magnetic field is applied and positions of measurement points in the first exemplary embodiment.

FIG. 3 schematically shows a layout of temperature sensors in the first exemplary embodiment and a second exemplary embodiment of the invention.

FIG. 4 is a block diagram showing a relevant part of the pull-up device in the first and second exemplary embodiments.

FIG. 5A schematically shows a relationship between the application direction of the horizontal magnetic field and a direction of a convection flow in the silicon melt in the first and second exemplary embodiments of the invention, showing a clockwise convection flow.

FIG. 5B schematically shows a relationship between the application direction of the horizontal magnetic field and a direction of a convection flow in the silicon melt in the first and second exemplary embodiments of the invention, showing an anticlockwise convection flow.

FIG. 6 schematically shows a change in the convection flow in the silicon melt in the first and second exemplary embodiments.

FIG. 7 schematically shows a relationship between a temperature change at first to third measurement points and a temperature distribution on a surface of the silicon melt in the first and second exemplary embodiments.

Figure 10:
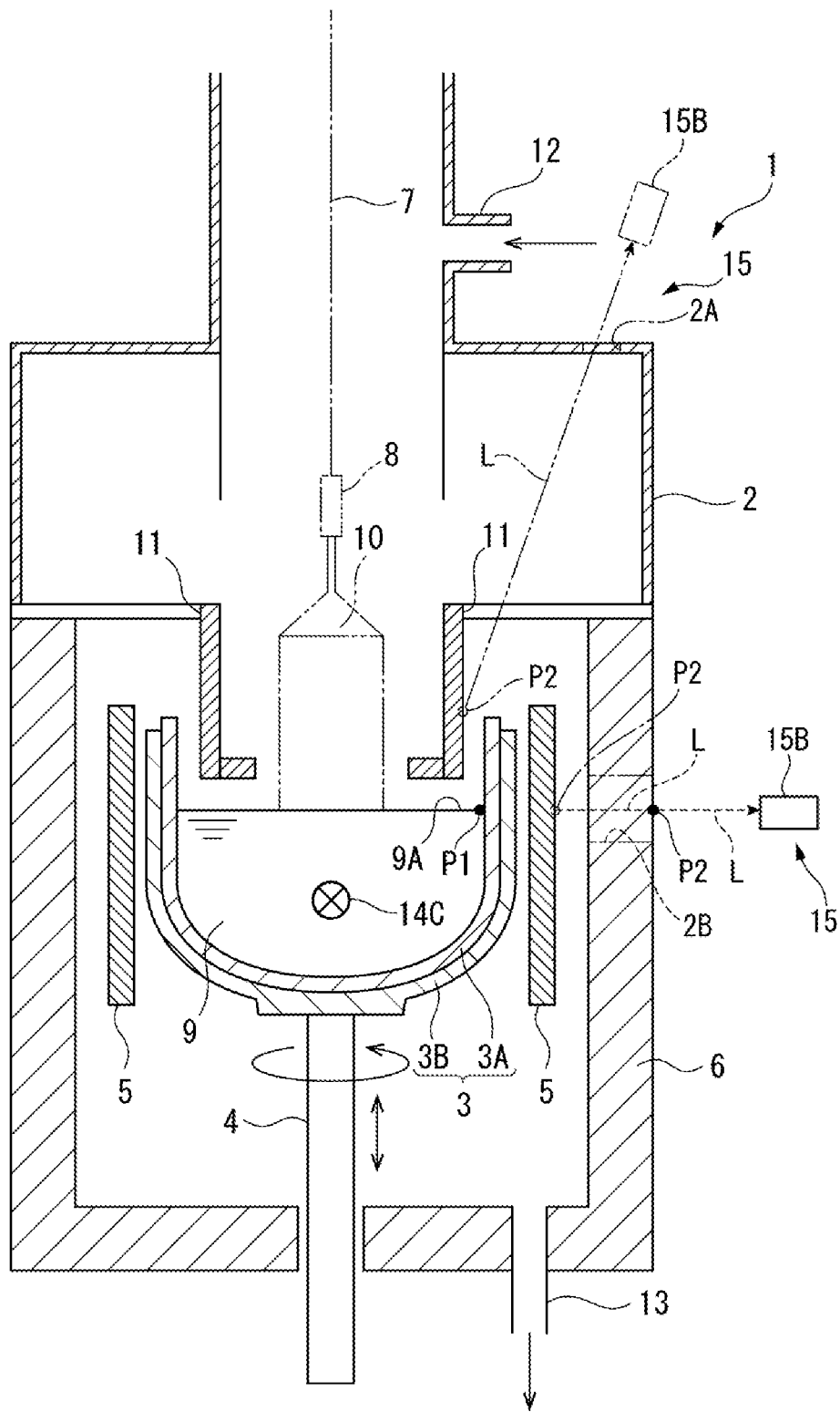

FIG. 10 schematically shows an arrangement of a pull-up device according to the second exemplary embodiment.

Figure 11:
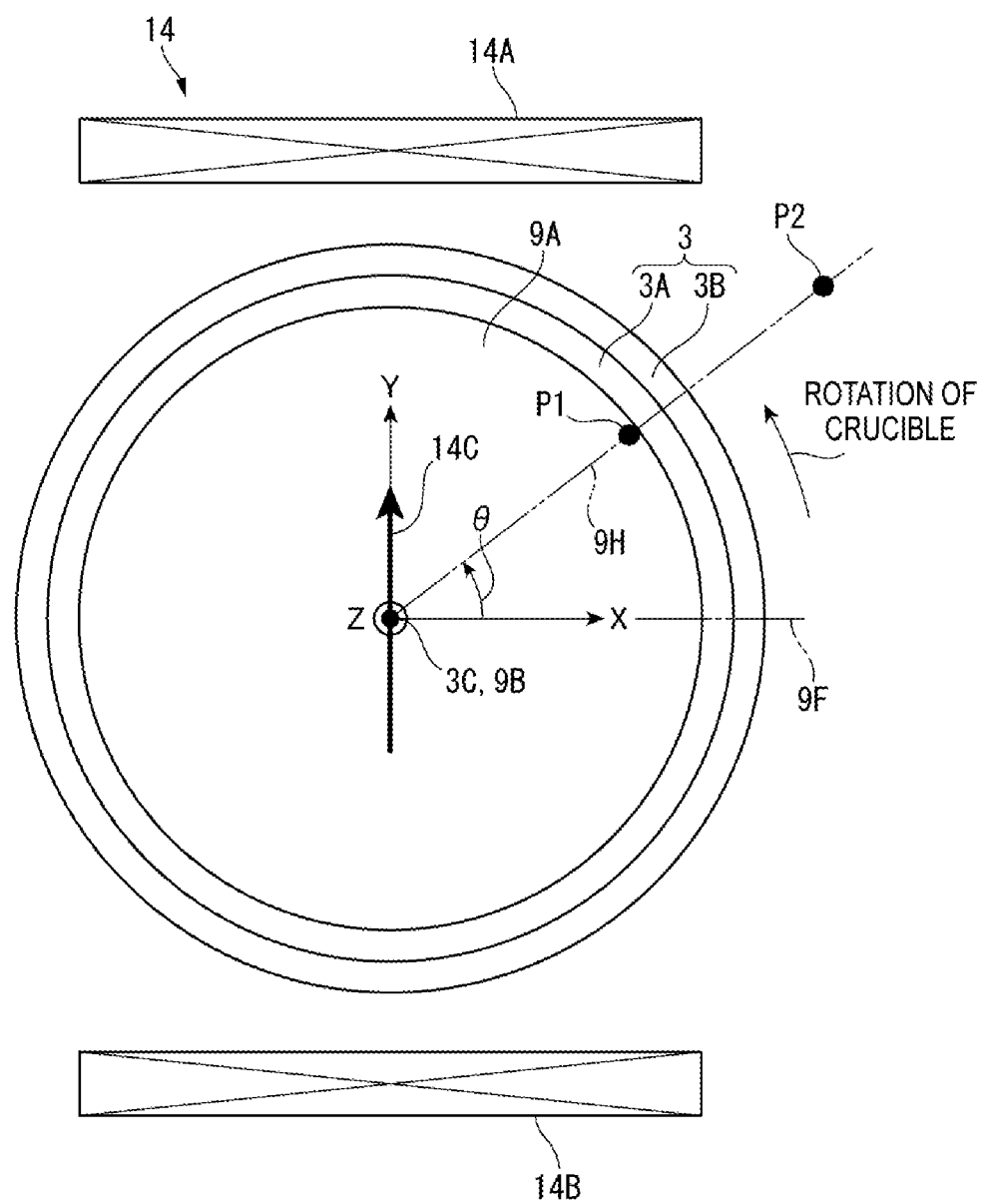

FIG. 11 schematically shows positions of measurement points and how the horizontal magnetic field is applied in the second exemplary embodiment and a modification of the invention.

Figure 12:
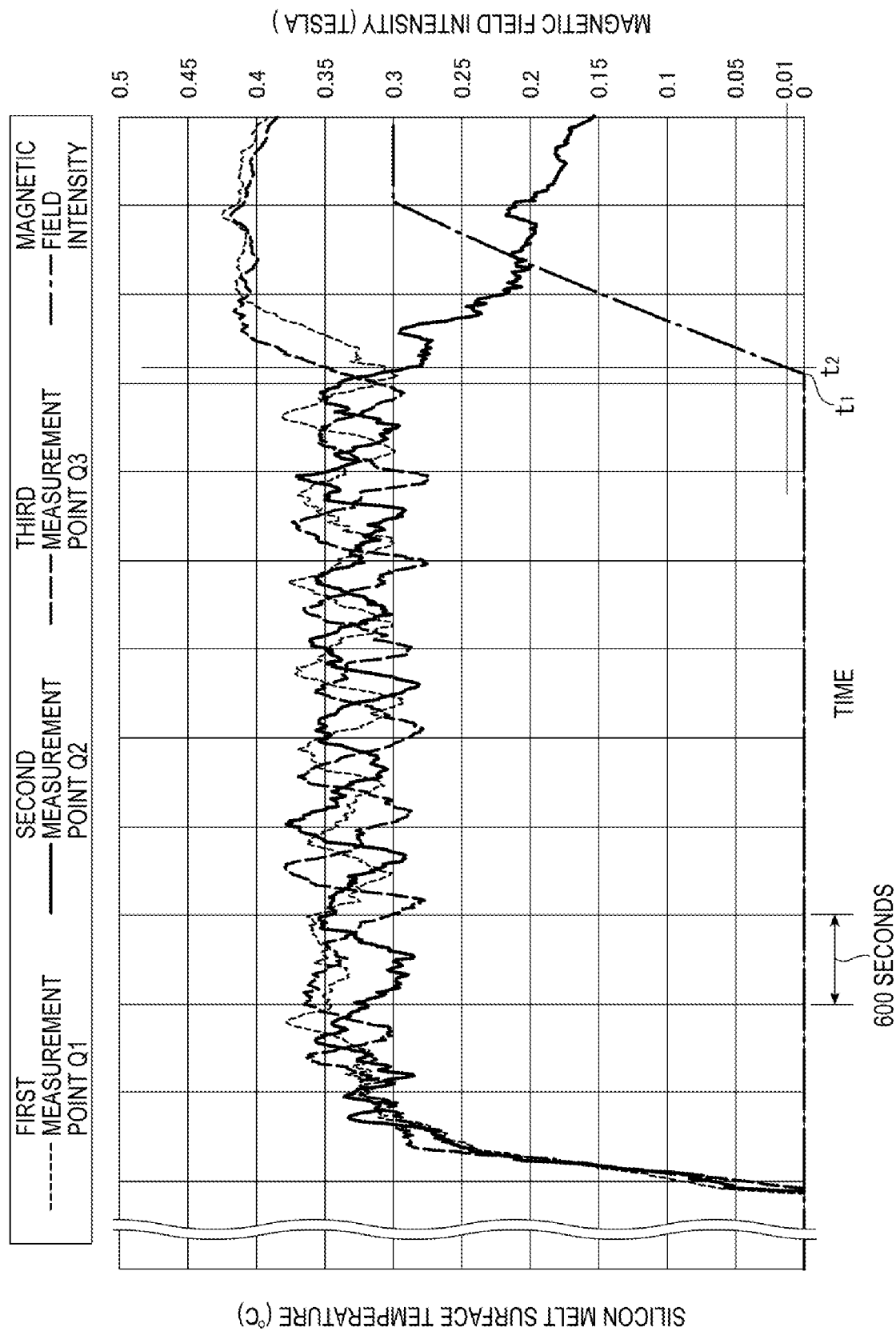

FIG. 12 is a graph showing a relationship between temperatures at first to third measurement points at each time and a magnetic field intensity in Experiment 1 of Examples in the invention.

Figure 13:
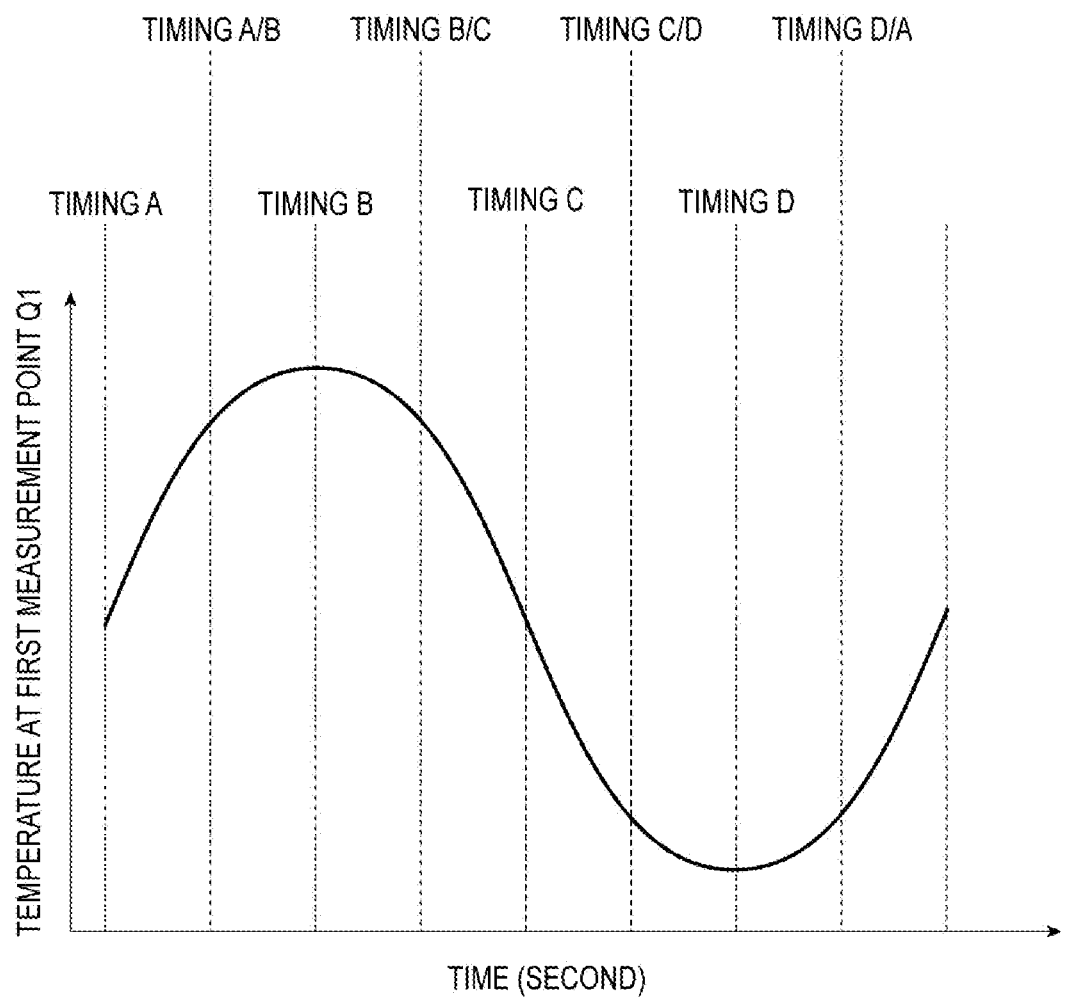

FIG. 13 is a graph showing a relationship between temperatures at first measurement point at each time and a timing for applying the horizontal magnetic field in Experiment 2 of Examples in the invention.

DESCRIPTION OF EMBODIMENT(S)

Exemplary embodiments of the invention will be described below with reference to the attached drawings.

[1] First Exemplary Embodiment

Figure 1:
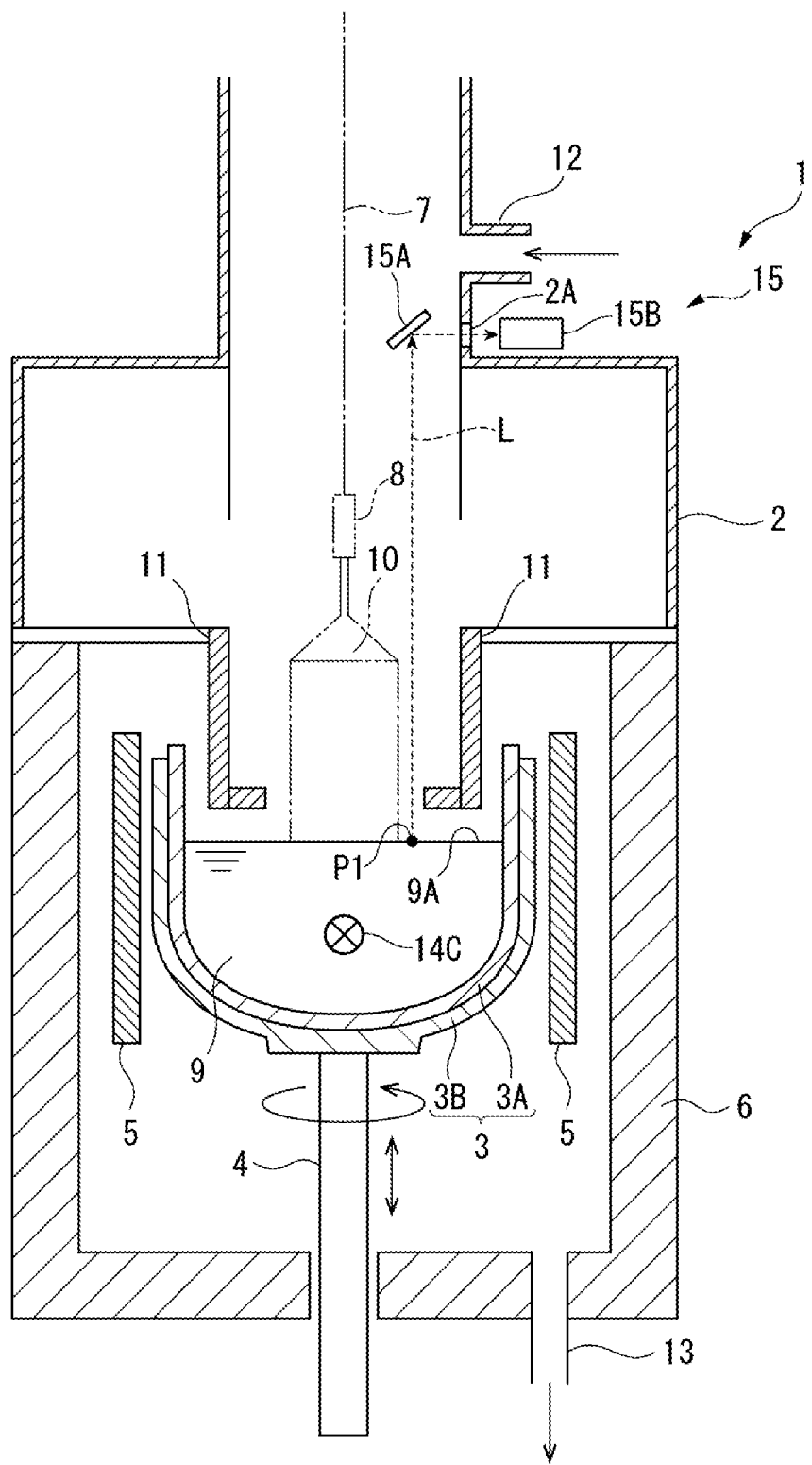

FIG. 1 schematically illustrates an exemplary structure of a pull-up device 1 of monocrystalline silicon to which a manufacturing method of monocrystalline silicon 10 according to a first exemplary embodiment of the invention is applicable. The pull-up device 1, which is a device for pulling up the monocrystalline silicon 10 through the Czochralski method, includes a chamber 2 forming an outer shell and a crucible 3 disposed at the center of the chamber 2.

The crucible 3, which has a double structure of an inner quartz crucible 3A and an outer graphite crucible 3B, is fixed to an upper end of a support shaft 4 that is rotatable and movable up and down.

A resistance heating type heater 5 is provided outside the crucible 3 in a manner to surround the crucible 3. A heat insulation material 6 is provided outside the heater 5 and along an inner surface of the chamber 2.

A pull-up shaft 7 (e.g., a wire), which is coaxial with the support shaft 4 and configured to rotate at a predetermined speed in a direction opposite to or the same as the rotation direction of the support shaft 4, is provided above the crucible 3. A seed crystal 8 is attached to a lower end of the pull-up shaft 7.

A hollow cylindrical heat shield 11, which surrounds the growing monocrystalline silicon 10, is disposed in the chamber 2 at a part above a silicon melt 9 in the crucible 3.

The heat shield 11, which shields the growing monocrystalline silicon 10 from high-temperature radiation heat from the silicon melt 9 in the crucible 3, the heater 5 and a side wall of the crucible 3, prevents outward heat diffusion from a solid-liquid interface (i.e. an interface on which crystal grows), and a vicinity thereof, whereby the heat shield 11 serves to control a temperature gradient of a central portion and an outer peripheral portion of the monocrystalline silicon in a direction of the pull-up shaft.

A gas inlet 12, through which an inert gas (e.g. Argon gas) is introduced into the chamber 2, is provided at an upper part of the chamber 2. An exhaust outlet 13, through which the gas in the chamber 2 is sucked and discharged when a vacuum pump (not shown) is driven, is provided at a lower part of the chamber 2.

The inert gas introduced in the chamber 2 through the gas inlet 12, which flows downward between the growing monocrystalline silicon 10 and the heat shield 11 and then flows into a space between a lower end of the heat shield 11 and a liquid surface of the silicon melt 9, flows toward an outside of the heat shield 11 and an outside of the crucible 3 and then downward along the outside of the crucible 3, to be discharged from the exhaust outlet 13.

Figure 2:
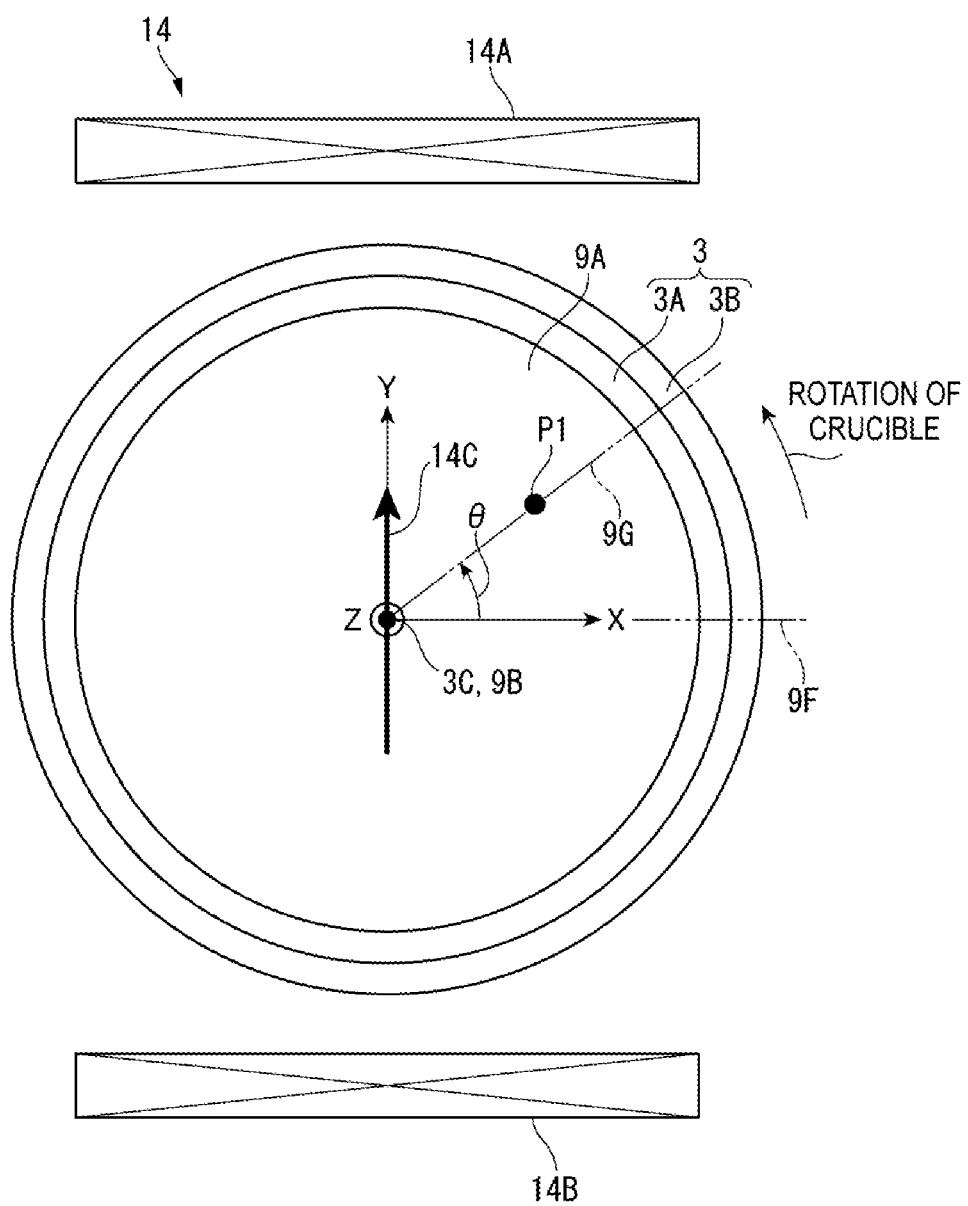

The pull-up device 1 includes a magnetic-field applying portion 14 as shown in FIG. 2 and a temperature sensor 15.

The magnetic-field applying portion 14 includes a first magnetic body 14A and a second magnetic body 14B each in a form of a solenoid coil. The first and second magnetic bodies 14A and 14B are provided outside the chamber 2 in a manner to face each other across the crucible 3. The magnetic-field applying portion 14 preferably applies a horizontal magnetic field such that a central magnetic field line 14C passes through a center axis 3C of a quartz crucible 3A and the central magnetic field line 14C is directed in a top direction in FIG. 2 (i.e., a direction from a nearby side to a far side on a paper in FIG. 1). A height of the central magnetic field line 14C, which is not particularly limited, may be determined such that the central magnetic field line 14C passes through an inside or an outside of the silicon melt 9 depending on the quality of the monocrystalline silicon 10.

The temperature sensor 15 is configured to measure a temperature at a first measurement point P1 on a surface 9A of the silicon melt 9. Provided that a distance from a center 9B of the surface 9A of the silicon melt 9 to the first measurement point P1 is denoted as R and a radius of an inner diameter of the quartz crucible 3A is denoted as RC, the temperature sensor 15 preferably measures the first measurement point P1 satisfying a relationship of R/RC being 0.375 or more and less than 1.

The first measurement point P1 is located at a position offset from the center 9B of the surface 9A (i.e. at a position remote from the rotation center of the quartz crucible 3A). As shown in FIG. 2, in a right-handed XYZ orthogonal coordinate system where an origin is defined by the center 9B of the surface 9A of the silicon melt 9, an upper direction is defined by a positive direction in a Z axis (upper direction in FIG. 1, near side of the sheet of FIG. 2), and a positive direction in a Y axis (far side of the sheet of FIG. 1, upper direction in FIG. 2) is defined by an application direction of the horizontal magnetic field, the first measurement point P1 is located at a position where a first imaginary line 9F and a second imaginary line 9G forms a positive angle θ, the first imaginary line 9F being defined by a line extending from the center 9B in a positive direction in an X axis (clockwise in FIG. 2), the second imaginary line 9G being defined by a line passing through the center 9B and the first measurement point P1, the positive angle being defined by an angle in the rotation direction of the quartz crucible 3A. In the present exemplary embodiment, where the rotation direction of the quartz crucible 3A is anticlockwise in FIG. 2, the first measurement point P1 is defined on the imaginary line 9G at a position rotated anticlockwise from the first imaginary line 9F by an angle θ. It should be noted that, when the rotation direction of the quartz crucible 3A is clockwise in FIG. 2, the positive angle formed by the first imaginary line 9F and the second imaginary line 9G is the angle formed when the first imaginary line 9F is rotated clockwise (i.e. 360 degrees−θ in the example shown in FIG. 2).

The temperature sensor 15 includes a reflector 15A and a radiation thermometer 15B.

Figure 3:
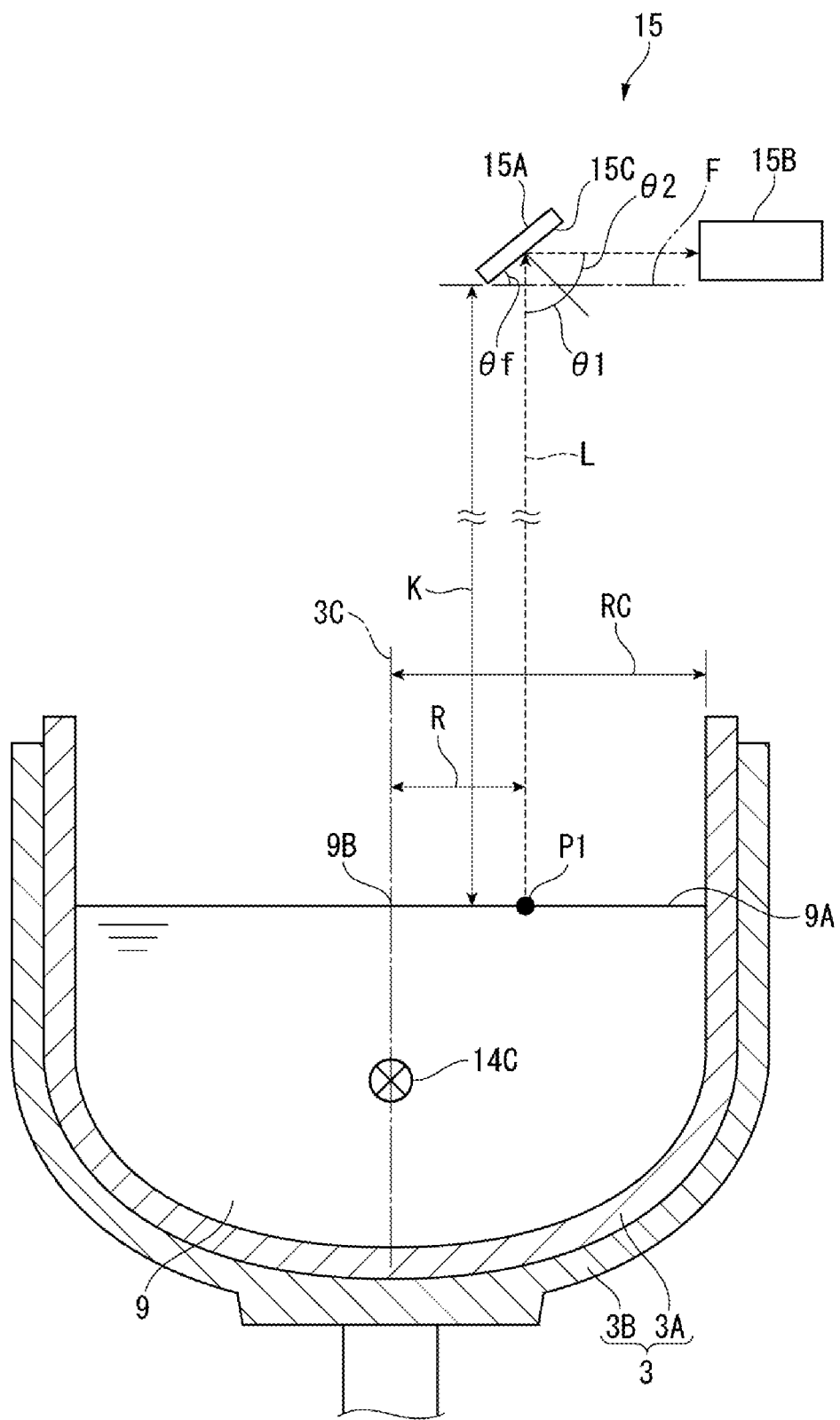

The reflector 15A is provided inside the chamber 2. The reflector 15A is preferably provided such that a distance (height) K from a lower end of the reflector 15A to the surface 9A of the silicon melt 9 is in range from 600 mm to 5000 mm as shown in FIG. 3. Moreover, the reflector 15A is preferably provided such that an angle θf formed by a reflection surface 15C of the reflector 15A and a horizontal plane F is in a range from 40 degrees to 50 degrees. With this arrangement, a sum of an incidence angle 81 and a reflection angle 82 of a radiation light L radiated from the first measurement point P1 in a direction opposite to a gravity direction is in a range from 80 degrees to 100 degrees. The reflector 15A is preferably in a form of a silicon mirror having a mirror-polished surface as the reflection surface 15C. The radiation thermometer 15B is provided outside the chamber 2. The radiation thermometer 15B is configured to receive the radiation light L incident through quartz windows 2A provided to the chamber 2 and measure the temperature at the first measurement point P1 in a non-contact manner.

Figure 4:
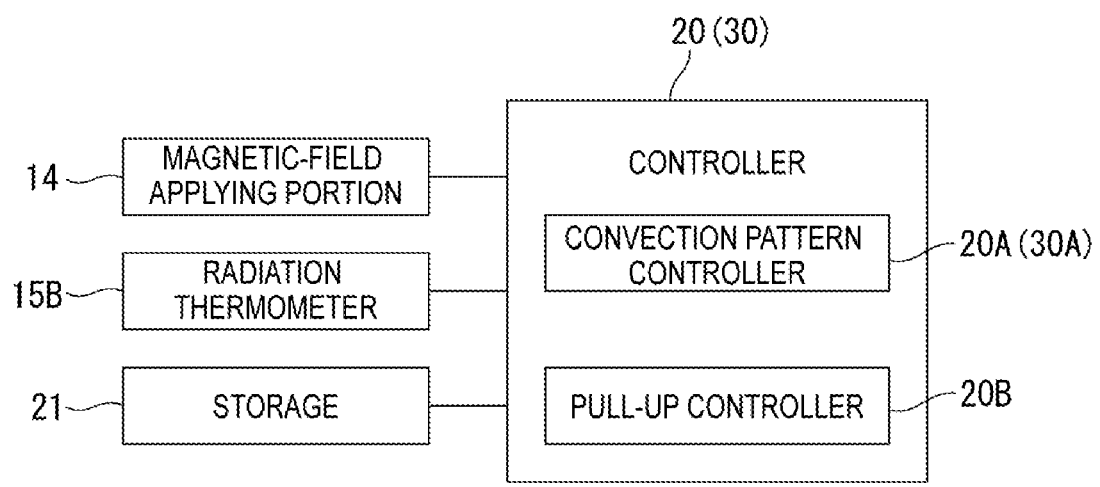

Moreover, the pull-up device 1 incudes a controller 20 and a storage 21 as shown in FIG. 4.

The controller 20 includes a convection pattern controller 20A and a pull-up controller 20B.

The convection pattern controller 20A fixes a direction of a convection flow 90 (see FIGS. 5A and 5B) in a field-orthogonal cross-section (a plane orthogonal to the direction in which the horizontal magnetic field is applied) of the silicon melt 9 as viewed in the negative direction of the Y axis in FIG. 2 (the lower side in FIG. 2), based on the measurement results at the first measurement point P1 by the temperature sensor 15.

The pull-up controller 20B pulls up the monocrystalline silicon 10 after the convection pattern controller 20A fixes the direction of the convection flow 90.

[2] Background for Invention

The inventors have known that, even if the monocrystalline silicon 10 is pulled up using the same pull-up device 1 under the same pull-up conditions, an oxygen concentration of the pulled-up monocrystalline silicon 10 may sometimes become high or low. In order to solve this problem, a research has been typically focused on the pull-up conditions and the like. However, no definitive solution has been found.

Figure 5A:
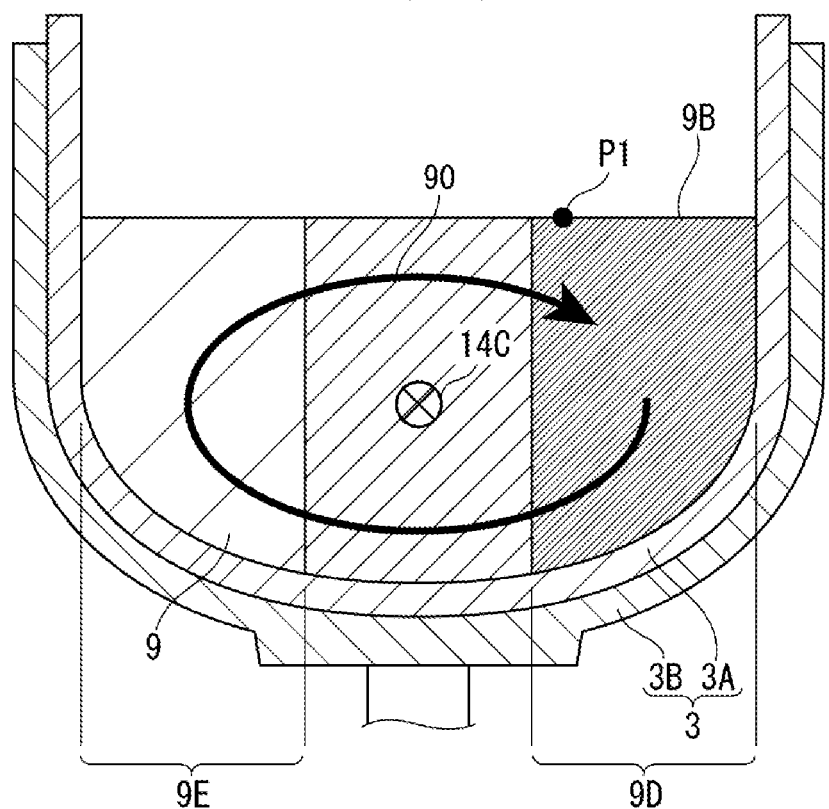
Figure 5B:
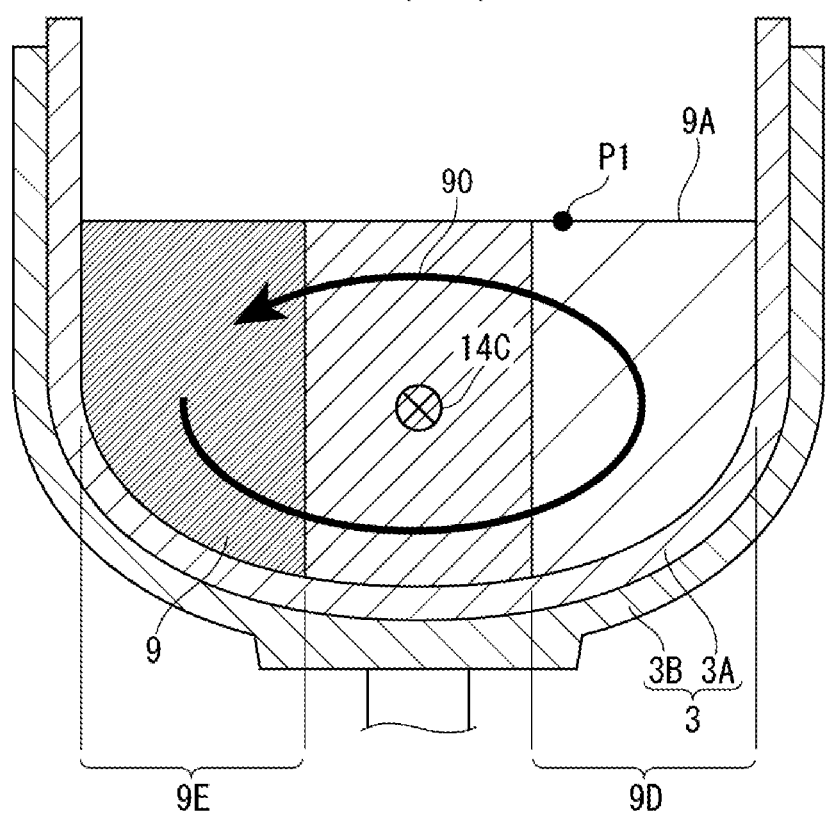

After further research, the inventors have found that, when a solid polycrystalline silicon feedstock is put into the quartz crucible 3A to be dissolved therein and a horizontal magnetic field is applied, the convection flow 90 rotating in a direction from the bottom of the quartz crucible 3A toward the surface 9A of the silicon melt 9 around magnetic field lines of the horizontal magnetic field is present in the field-orthogonal cross-section (i.e., a cross-sectional plane viewed from the second magnetic body 14B (from the near side of the sheet of FIG. 1, and a lower side in FIG. 2)). The rotation direction of the convection flow 90 is shown in two convection patterns of a case where a clockwise rotation is dominant as shown in FIG. 5A and a case where an anticlockwise rotation is dominant as shown in FIG. 5B.

The inventors have speculated that the occurrence of such a phenomenon is due to the following mechanism.

First, in a state where the horizontal magnetic field is not applied and the quartz crucible 3A is not rotated, the silicon melt 9 is heated in the vicinity of an outer periphery of the quartz crucible 3A, a convection flow occurs in an ascending direction from the bottom of the silicon melt 9 toward the surface 9A. The ascending silicon melt 9 is cooled at the surface 9A of the silicon melt 9, returns to the bottom of the quartz crucible 3A at the center of the quartz crucible 3A, so that a convection flow occurs in a descending direction.

When the convection flow that ascends in the outer periphery of the outer periphery and descends at the center thereof occurs, a position of the downward flow randomly shifts to be offset from the center due to instability of thermal convection. Such a downward flow is generated by a temperature distribution in which the temperature at a part of the surface 9A of the silicon melt 9 corresponding to the downward flow is the lowest and the temperature gradually increases toward an outer part of the surface 9A. For instance, in a state of FIG. 6(A), a temperature of a first region A1 whose center is displaced from the rotation center of the quartz crucible 3A is the lowest, and temperatures of a second region A2, a third region A3, fourth region A4 and a fifth region A5 which are sequentially located outside of the first region A1 become higher in this order.

In the state of FIG. 6(A), when a horizontal magnetic field whose central magnetic field line 14C passes through the central axis 3C of the quartz crucible 3A is applied, rotation of the downward flow is gradually restrained when viewed from above the quartz crucible 3A, and is then restrained at a position offset from the position of the magnetic field line 14C at the center of the horizontal magnetic field as shown in FIG. 6(B).

It is considered that the rotation of the downward flow is restrained after an intensity of the horizontal magnetic field acting on the silicon melt 9 becomes larger than a specific strength. Accordingly, the rotation of the downward flow is not restrained immediately after the application of the horizontal magnetic field is started, but is restrained after a predetermined time has elapsed from the start of the application.

It is reported that a change in the flow inside the silicon melt 9 due to the application of the magnetic field is generally represented by a magnetic number M, which is a dimensionless number obtained by a formula (5) below (Jpn. J. Appl. Phys., Vol. 33 (1994) Part. 2 No. 4A, pp. L487-490).

Numerical Formula 5

$$M = \frac{\sigma B_0^2 h}{\rho v_0} \quad (5)$$

In the formula (5), G represents an electric conductivity of the silicon melt 9, Bo represents the applied magnetic flux density, h represents a depth of the silicon melt 9, $\rho$ represents a density of the silicon melt 9, and $v_0$ represents an average flow velocity of the silicon melt 9 in the absence of the magnetic field.

In an exemplary embodiment, it has been found that the minimum value of the specific strength of the horizontal magnetic field in which the rotation of the downward flow is restrained is 0.01 tesla. Magnetic Number at 0.01 tesla is 1.904. Even with the amount of the silicon melt 9 and the diameter of the quartz crucible 3A different from those of the exemplary embodiment, it is considered that the restraining effect (braking effect) of the downward flow by the magnetic field occurs at least at the magnetic field strength (magnetic flux density) at which Magnetic Number is 1.904.

Figure 6:
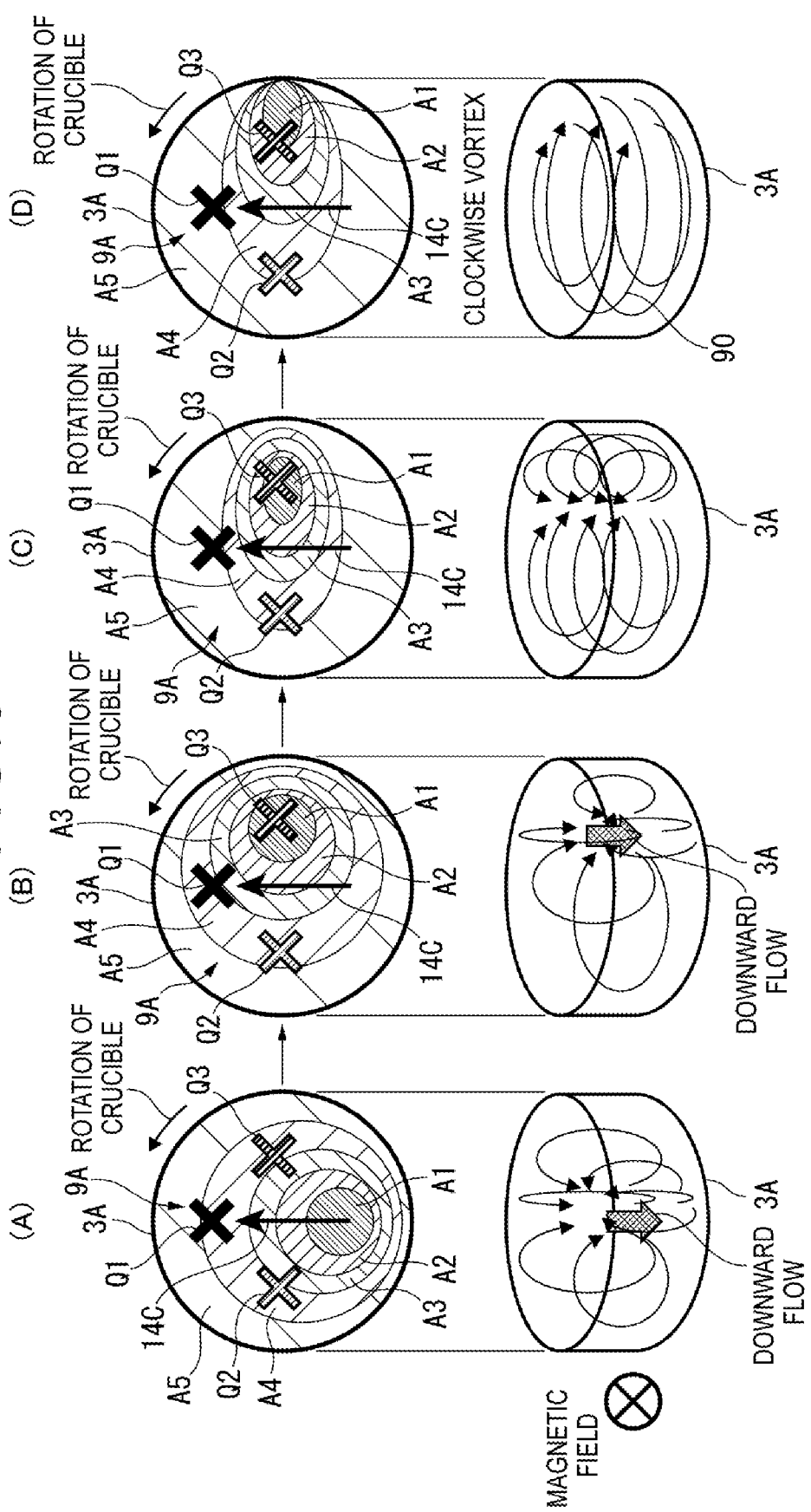

When the intensity of the horizontal magnetic field is further increased from the state shown in FIG. 6(B), the magnitude of the convection flow in the ascending direction on the right side and the left side of the descending flow changes as shown in FIG. 6 (C), where the upward convection flow on the left side of the downward flow becomes dominant.

Finally, when the magnetic field strength reaches 0.2 tesla, the convection flow in the ascending direction on the right side of the descending flow disappears as shown in FIG. 6(D), where the convection flow flows upward (i.e. in the ascending direction) on the left side and downward (i.e. in the descending direction) on the right side to create the clockwise convection flow 90. In the state of the clockwise convection flow 90, as shown in FIG. 5A, the temperature gradually is increased from the right region 9D toward the left region 9E of the silicon melt 9 in the magnetic-field orthogonal cross-section.

In contrast, if a start position of the downward flow in FIG. 6 (A) is shifted by 180 degrees in the rotation direction of the quartz crucible 3A, the downward flow is restrained at a position on the left side where a phase is shifted by 180 degrees from that in FIG. 6(C), resulting in the anticlockwise convection flow 90. In the state of the anticlockwise convection flow 90, as shown in FIG. 5B, the temperature is gradually decreased from the right region 9D toward the left region 9E of the silicon melt 9.

Such a clockwise or anticlockwise convection flow 90 of the silicon melt 9 is maintained unless the intensity of the horizontal magnetic field is set to less than 0.2 tesla.

Figure 7:
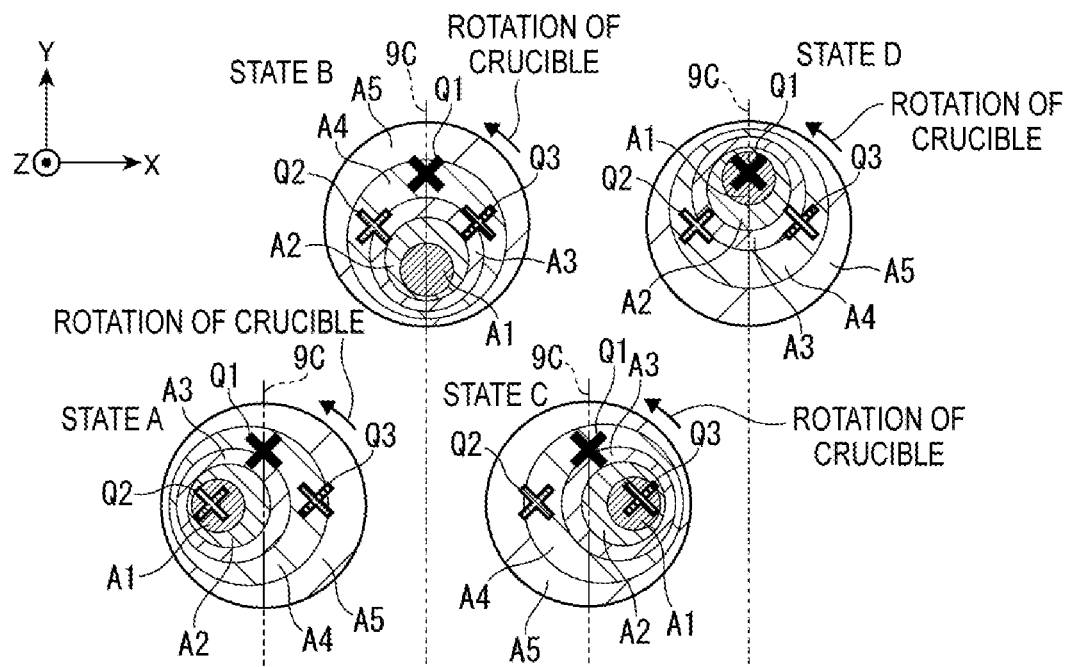
Figure 7:
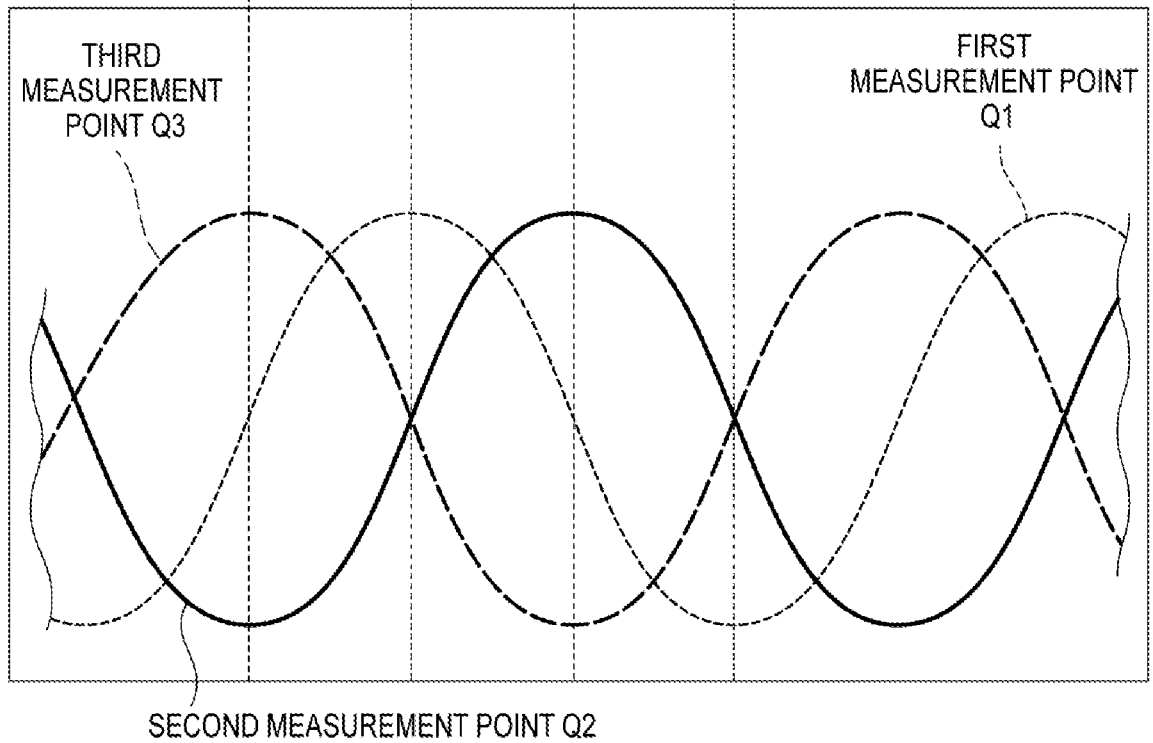

The temperatures at the first to third measurement points Q1 to Q3 on the surface 9A of the silicon melt 9 in accordance with the rotation of the quartz crucible 3A, when measured, are speculated to change as shown in FIG. 7. The rotation direction of the quartz crucible 3A is anticlockwise as viewed from above. The first measurement point Q1 is located on an imaginary line 9C passing through the center of the surface 9A of the silicon melt 9 and parallel to the magnetic field line 14C at the center of the horizontal magnetic field (i.e. overlapping the Y axis in the right-handed XYZ orthogonal coordinate system defined in FIG. 2 and the central magnetic field line 14C). The second measurement point Q2 is located at a position rotated anticlockwise by 90 degrees from the first measurement point Q1 around the center 9B of the surface 9A. The third measurement point Q3 is located at a position rotated clockwise by 90 degrees from the first measurement point Q1. In other words, when the positive angle is defined as the angle in the rotation direction of the quartz crucible 3A, the positive angles defined by the first imaginary line 9F and the second imaginary line 9G passing through the center 9B and the first, second, and third measurement points Q1, Q2, Q3 are 90 degrees, 180 degrees, and 0 degrees, respectively.

The temperature change at the first to third measurement points Q1 to Q3 in accordance with the rotation of the quartz crucible 3A can be approximated by periodic functions whose phases are mutually offset by 90 degrees.

It is found that, when a horizontal magnetic field of 0.01 tesla is applied to the silicon melt 9 during a period from a state B to a state D shown in FIG. 7 and the magnetic field intensity is subsequently raised to 0.2 tesla, the direction of the convection flow 90 becomes clockwise where the temperature at the left side is higher than at the right side and, when the horizontal magnetic field of 0.01 tesla is applied during the period from the state D to the state B, the direction of the convection flow 90 becomes anticlockwise where the temperature at the right side is higher than at the left side.

In other words, focusing on the measurement results at the third measurement point Q3, as shown by a sine function representing the temperature change at the third measurement point Q3, the clockwise convection flow 90 is generated when the horizontal magnetic field of 0.01 tesla is applied in a first timing during a period from the state B (value of the sine function=0) through a state C (minimum value of the sine function) to the state D (value of the sine function=0 again) (i.e. while the central part of the downward flow (a part with a minimum temperature in the first region A1 on the surface 9A of the silicon melt 9) is in a positive side (right side in FIG. 7) of the X axis with respect to the imaginary line 9C). It should be noted that the central part of the downward flow can be identified by the radiation thermometer based on its lower temperature than the other part. In contrast, the anticlockwise convection flow 90 is generated when the horizontal magnetic field of 0.01 tesla is applied in a second timing during a period from the state D (value of the sine function=0) through a state A (maximum value of the sine function) to the state B (value of the sine function=0 again) (i.e. while the central part of the downward flow (a part with a minimum temperature) is in a negative side (left side in FIG. 7) of the X axis with respect to the imaginary line 9C).

Using a numerical formula, the anticlockwise convection flow 90 can be generated when the horizontal magnetic field of 0.01 tesla is applied to the silicon melt 9 at a time $t_\alpha$ satisfying a formula (6) below (time 0=the timing of the state D) and then raising the magnetic field intensity to 0.2 tesla. Meanwhile, the clockwise convection flow 90 can be generated by applying the horizontal magnetic field of 0.01 tesla at a timing after a time $\pi/\omega$ from the time represented by the formula (6) and subsequently raising the magnetic field intensity to 0.2 tesla.

Numerical Formula 6

$$\frac{1}{\omega}\{2n\pi\} < t_\alpha < \frac{1}{\omega}\{(2n+1)\pi\} \quad (6)$$

A predetermined time is necessary before the horizontal magnetic field of 0.01 tesla is actually applied to the silicon melt 9 after driving the magnetic-field applying portion 14. When an increase rate of magnetic-field intensity (tesla/sec.) is represented by H, the time before the horizontal magnetic field of 0.01 tesla is applied to the silicon melt 9 is 0.01/H. Considering the above, it is necessary to drive the magnetic-field applying portion 14 at a time 0.01/H before the time $t_\alpha$ represented by the formula (6) as shown in a formula (7) below in order to apply the horizontal magnetic field of 0.01 tesla to the silicon melt 9.

Numerical Formula 7

$$\frac{1}{\omega}\{2n\pi\} - \frac{0.01}{H} < t_\alpha < \frac{1}{\omega}\{(2n+1)\pi\} - \frac{0.01}{H} \quad (7)$$

Considering the measurement at a point other than the third measurement point Q3, with the temperature change being represented by a sine function of the formula (1), the formula (7) is represented by the formula (2) in consideration of the positive angle θ corresponding to the measurement point shown in FIG. 2. In other words, the direction of the convection flow 90 of the silicon melt 9 can be fixed in a desired single direction by starting the drive of the magnetic-field applying portion 14 at the time $t_\alpha$ satisfying the formula (2), Further, since the pull-up device 1, which is symmetrically designed, is not actually symmetric, the thermal environment therein is also not symmetric. The asymmetry of the thermal environment is exemplarily caused by the asymmetric shapes of the members such as the chamber 2, the crucible 3, the heater 5, and the heat shield 11, and the asymmetric installation positions of various components in the chamber 2.

For instance, in the field-orthogonal cross-section, the pull-up device 1 may create therein a first thermal environment in which the temperature on the left side is higher than that on the right side of the quartz crucible 3A or a second thermal environment in which the temperature on the left side is lower than that on the right side.

Under the first thermal environment, when the convection flow 90 is fixed clockwise in the magnetic-field orthogonal cross-section, the left region 9E of the silicon melt 9 becomes higher in temperature due to the synergistic effect with the first thermal environment. Accordingly, the amount of oxygen eluted from the quartz crucible 3A increases as shown in Table 1 below. In contrast, when the convection flow 90 is fixed anticlockwise, the synergistic effect with the first thermal environment as in the case of the clockwise rotation does not occur and the left region 9E does not become so high in temperature. Accordingly, the amount of oxygen eluted from the quartz crucible 3A becomes not so high as that in the clockwise convection flow 90.

Accordingly, under the first thermal environment, it is presumed that the oxygen concentration of the monocrystalline silicon 10 is high when the convection flow 90 is clockwise, and is not high (low) when the convection flow 90 is anticlockwise.

TABLE 1

| Thermal environment | Melt surface temperature | Direction of convection flow | Oxygen eluted from quartz crucible | Oxygen concentration in straight body |
|---|---|---|---|---|
| first thermal environment (higher temperature at left side) | first measurement point P1 > second measurement point P2 | clockwise | large | high |
| | first measurement point P1 < second measurement point P2 | anticlockwise | average | low |

Under the second thermal environment, when the convection flow 90 is fixed anticlockwise, the right region 9D of the silicon melt 9 becomes higher in temperature. Accordingly, the amount of oxygen eluted from the quartz crucible 3A increases as shown in Table 2. In contrast, when the convection flow 90 is fixed clockwise, the right region 9E does not become so high in temperature unlike the anticlockwise convection flow 90. Accordingly, the amount of oxygen eluted from the quartz crucible 3A becomes not so high.

Accordingly, under the second thermal environment, it is presumed that the oxygen concentration of the monocrystalline silicon 10 is high when the convection flow 90 is estimated to be anticlockwise, and the oxygen concentration is low when the convection flow 90 is estimated to be clockwise.

TABLE 2

| Thermal environment | Melt surface temperature | Direction of convection flow | Oxygen eluted from quartz crucible | Oxygen concentration in straight body |
|---|---|---|---|---|
| second thermal environment (higher temperature at right side) | first measurement point P1 < second measurement point P2 | anticlockwise | large | high |
| | first measurement point P1 > second measurement point P2 | clockwise | average | low |

From the above, the inventors reached an idea that the position of the rotation of the downward flow of the silicon melt M as viewed from above can be fixed by measuring the temperature at predetermined measurement point(s) on the surface 9A of the silicon melt 9 and applying the horizontal magnetic field of 0.01 tesla at the timing when the temperature change at the measurement point(s) reaches a predetermined state; the convection flow 90 of the silicon melt 9 can be fixed in the desired single direction by subsequently raising the magnetic field intensity to 0.2 tesla; and the variation in the oxygen concentration for each monocrystalline silicon 10 can be restrained by selecting the fixed direction depending on the asymmetric structure of the environment in the furnace of the pull-up device 1.

[3] Manufacturing Method of Monocrystalline Silicon

Next, a manufacturing method of monocrystalline silicon in the first exemplary embodiment will be described with reference to the flowchart shown in FIG. 8 and the illustration shown in FIG. 9.

Firstly, it should be understood that the thermal environment of the pull-up device 1 is the first thermal environment or the second thermal environment described above.

Further, when the direction of the convection flow 90 of the silicon melt 9 is clockwise or anticlockwise, pull-up conditions (e.g., a flow rate of inert gas, an internal pressure of the chamber 2, and a rotation speed of the quartz crucible 3A) for achieving a desired value of the oxygen concentration of the monocrystalline silicon 10 are determined in advance as predetermined conditions, and the pull-up conditions are stored in the storage 21.

For instance, as shown in Table 3 below, under the first thermal environment, when the direction of the convection flow 90 is clockwise, pull-up conditions A to achieve a concentration A for the oxygen concentration are stored as the predetermined conditions. The oxygen concentration of the predetermined condition may be values of the oxygen concentration at a plurality of points in the longitudinal direction of the straight body, or may be an average of the values of the oxygen concentration at the plurality of points.

TABLE 3

| Thermal environment | Directoin of convection flow | Pull-up conditions | Oxygen concentration in straight body |
|---|---|---|---|
| first thermal environment (higher temperature at left side) | clockwise | pull-up condition A | concentration A |

Manufacturing of the monocrystalline silicon 10 is then started.

Figure 8:
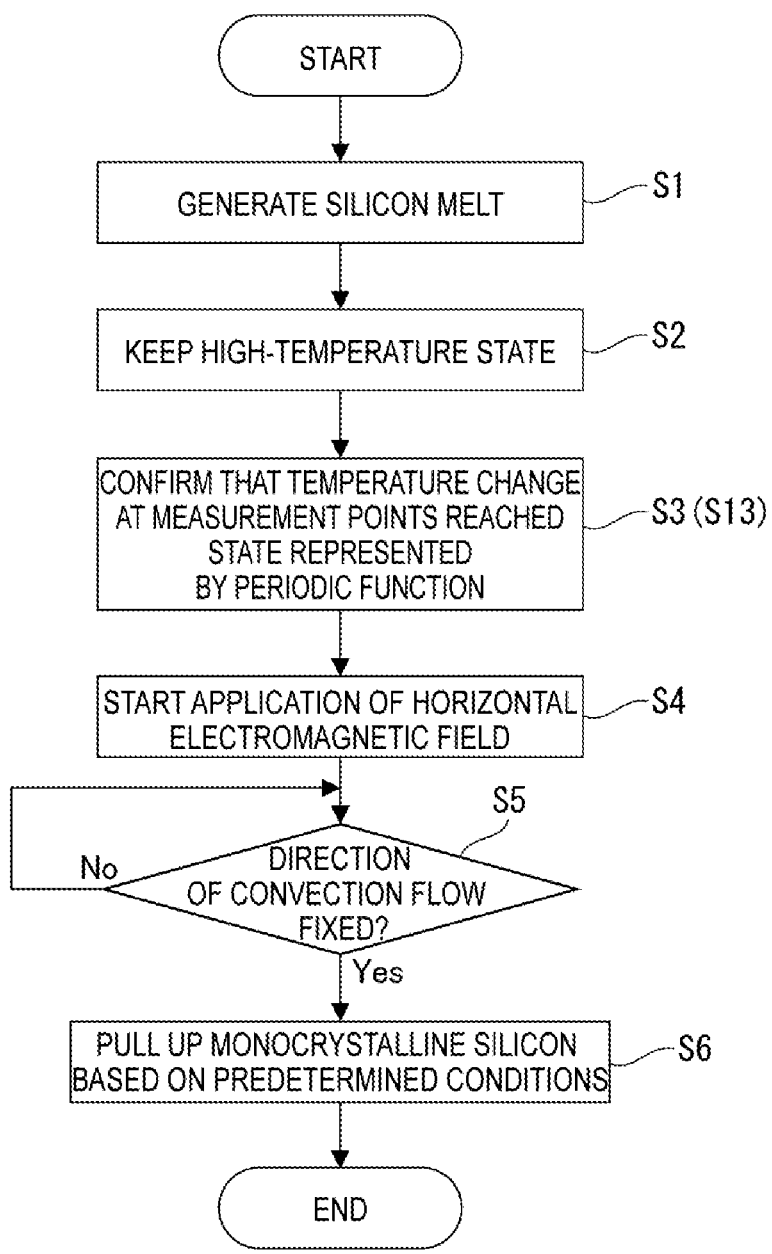
FIG. 8 is a flowchart showing a manufacturing method of monocrystalline silicon in the first and second exemplary embodiments.

Firstly, as shown in FIG. 8, while keeping the inside of the chamber 2 in an inert gas atmosphere under reduced pressure, the pull-up controller 20B rotates the crucible 3 and the solid material such as polycrystalline silicon filled in the crucible 3 is melted by heat from the heater 5 to produce the silicon melt 9 (Step S1) and keeps the chamber 2 in a high temperature (Step S2). The temperature sensor 15 starts measuring the temperature at the first measurement point P1, where the positive angle formed by the first imaginary line 9F and the second imaginary line 9G is θ. In the chamber 2, which is kept at a high temperature, the temperature change at the first measurement point P1 is represented by the periodic function of the formula (1), as shown in FIG. 9.

Figure 9:
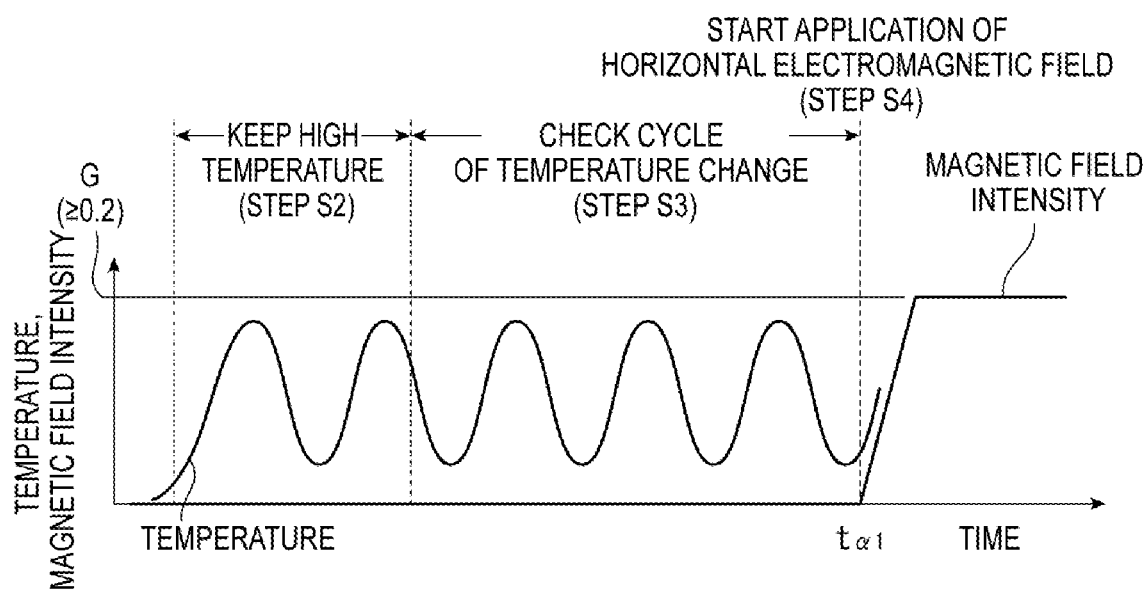
FIG. 9 is an illustration showing the manufacturing method of monocrystalline silicon in the first and second exemplary embodiments.

When confirming that the temperature change at the first measurement point P1 is in the state represented by the formula (1) (Step S3), the convection pattern controller 20A drives the magnetic-field applying portion 14 at a timing at which a time $t_{\alpha1}$ satisfies a formula (8) below as shown in FIG. 9 to start applying the horizontal magnetic field to the silicon melt 9 (Step S4) while the increase rate of the magnetic-field intensity (tesla/sec.) (i.e. an inclination of a graph showing the magnetic field intensity in FIG. 9) is H, and then raises the magnetic field intensity to G tesla in a range from 0.2 tesla to 0.6 tesla.

Numerical Formula 8

$$\frac{1}{\omega}\{(2n+1)\pi - B - \theta\} - \frac{0.01}{H} < t_{\alpha1} < \frac{1}{\omega}\{(2(n+1))\pi - B - \theta\} - \frac{0.01}{H} \quad (8)$$

The left side of the formula (8) is the time at which the state B in FIG. 7 is reached and the right side is the time at which the state D is reached. Through the above process, the horizontal magnetic field of 0.01 tesla is applied to the silicon melt 9 at the first timing from the state B through the state C to the state D, and subsequently the magnetic field intensity is raised to 0.2 tesla, thus fixing the convection flow 90 clockwise.

Then, the pull-up controller 20B judges whether the direction of the convection flow 90 is fixed (Step S5). When the direction of the convection flow 90 is fixed to establish the state shown in FIG. 6(D), the periodic fluctuation in the temperature at the first measurement point P1 is eliminated and the temperature is stabilized. The pull-up controller 20B judges that the direction of the convection flow 90 is fixed when the temperature at the first measurement point P1 is stabilized.

Subsequently, the pull-up controller 20B dips the seed crystal 8 into the silicon melt 9 while controlling the rotation speed of the crucible 3 and applying the horizontal magnetic field under the predetermined conditions, and then pulls up the monocrystalline silicon 10 with a straight body having a desired oxygen concentration (Step S6).

Meanwhile, when the temperature at the first measurement point P1 continuously exhibits the periodic temperature change as represented by the formula (1), the pull-up controller 20B judges that the direction of the convection flow 90 is not fixed and again performs the process in Step S5 after an elapse of a predetermined time.

The processes of Steps S1 to S6 described above correspond to the method of manufacturing monocrystalline silicon of the invention, and the processes of Steps S1 to S4 correspond to the method of controlling the convection pattern of the silicon melt of the invention.

It should be noted that the process of checking the temperature change in Step S3, the process of starting the application of the horizontal magnetic field in Step S4, the process of judging whether the direction of the convection flow 90 is fixed in Step S5, and/or the pull-up process in Step S6 may be performed through an operation of the operator.

When it is hoped that the convection flow 90 should be fixed anticlockwise in the first thermal environment or the convection flow 90 should be fixed anticlockwise in the second thermal environment, the drive of the magnetic-field applying portion 14 may be started at a timing at which a time $t_{\alpha 2}$ satisfies a formula (9) below whose phase is shifted by 180 degrees with respect to the phase of the formula (8).

Numerical Formula 9

$$\frac{1}{\omega}\{2n\pi - B - \theta\} - \frac{0.01}{H} < t_{\alpha 2} < \frac{1}{\omega}\{(2n+1) - B - \theta\} - \frac{0.01}{H} \quad (9)$$

The left side of the formula (9) is the time at which the state D in FIG. 7 is reached and the right side is the time at which the state B is reached. Under the control based on the formula (9), the horizontal magnetic field of 0.01 tesla is thus applied to the silicon melt 9 at the second timing from the state D through the state A to the state B, and subsequently the magnetic field intensity is raised to 0.2 tesla, thus fixing the convection flow 90 anticlockwise. In this arrangement, the pull-up controller 20B judges whether the direction of the convection flow 90 is fixed in Step S5.

[4] Operations and Effects in First Exemplary Embodiment

According to the first exemplary embodiment, the horizontal magnetic field of 0.01 tesla is applied at the timing at which the temperature change at the first measurement point P1 of the silicon melt 9 reaches a predetermined state and the intensity of the horizontal magnetic field is subsequently raised to 0.2 tesla, so that the direction of the convection flow 90 can be always fixed in a constant direction, reducing the variation in the oxygen concentration for each monocrystalline silicon 10.

The change in the temperature of the surface 9A of the silicon melt 9, which is directly measured, can be more accurately determined, so that the direction of the convection flow can be more accurately fixed.

The use of the formula (8), which takes the time after starting the application of the horizontal magnetic field until the 0.01 tesla magnetic field is applied to the silicon melt 9 into account, allows the direction of the convection flow to be more accurately fixed.

Since the monocrystalline silicon 10 is pulled up after confirming that the direction of the convection flow is fixed, a phenomenon, in which crystal quality and actions during the pull-up process are divided in two groups even when the monocrystalline silicon 10 is pulled up with the same pull-up device 1 and under the same manufacture conditions, can be prevented.

[5] Second Exemplary Embodiment

Next, a second exemplary embodiment of the invention will be described. In the following description, the same reference numerals will be given to the components already described and the description thereof will be omitted.

The second exemplary embodiment is different from the first exemplary embodiment in terms of the location of the radiation thermometer 15B, the structure of the controller 30 and the manufacturing method of the monocrystalline silicon.

The radiation thermometer 15B is configured to, as shown in FIG. 10, measure a second measurement point P2 on a part of the furnace wall of the chamber 2 covering the heat insulation material 6. The second measurement point P2 is located substantially at the same level as the quartz crucible 3A. As shown in FIG. 11, in the right-handed XYZ orthogonal coordinate system where the origin is defined by the center 9B of the surface 9A of the silicon melt 9, the upper direction is defined by the positive direction of the Z axis (near side of the sheet of FIG. 11), and the positive direction of the Y axis (upper direction in FIG. 11) is defined by the application direction of the horizontal magnetic field, the second measurement point P2 is located at a position where the first imaginary line 9F and a second imaginary line 9H forms the positive angle θ, the first imaginary line 9F being defined by the line extending from the center 9B in the positive direction in X axis (rightward in FIG. 11), the second imaginary line 9H being defined by a line passing through the center 9B and the second measurement point P2, the positive angle being defined by the angle in the rotation direction of the quartz crucible 3A.

The controller 30 includes a convection pattern controller 30A and the pull-up controller 20B as shown in FIG. 4.

The convection pattern controller 30A is configured to estimate the temperature at the first measurement point P1 on the surface 9A of the silicon melt 9 based on the measurement results at the second measurement point P2 by the temperature sensor 15 as shown in FIG. 11. The first measurement point P1 is located on the second imaginary line 9H and at a position most remote from the center 9B on the surface 9A of the silicon melt 9.

[6] Manufacturing Method of Monocrystalline Silicon

Next, the manufacturing method of monocrystalline silicon in the second exemplary embodiment will be described.

It should be noted that, in the description below, the first thermal environment is supposed to be established in the pull-up device 1 and the predetermined information shown in Table 3 is supposed to be stored in the storage 21, in the same manner as in the first exemplary embodiment.

Firstly, as shown in FIG. 8, the pull-up controller 20B performs the processes of Steps S1 and S2 in the same manner as in the first exemplary embodiment. Further, the temperature sensor 15 starts measuring the temperature at the second measurement point P2. The temperature at the second measurement point P2 reflects the temperature at the first measurement point P1 on the second imaginary line 9H and on the surface 9A of the silicon melt 9.

When confirming that the temperature change at the first measurement point P1 is in the state represented by the formula (1) based on the measurement results at the second measurement point P2 (Step S13), the convection pattern controller 30A drives the magnetic-field applying portion 14 at a timing at which a time $t_{\beta 1}$ satisfies a formula (10) below to start applying the horizontal magnetic field to the silicon melt 9 while the increase rate of the magnetic-field intensity (tesla/sec.) (inclination of the graph in FIG. 9 showing the magnetic field intensity) is H (Step S4).

Numerical Formula 10

$$\frac{1}{\omega}\{(2n+1)\pi - B - \theta\} - \frac{0.01}{H} - T_{ex} < \quad (10)$$
$$t_{\beta 1} < \frac{1}{\omega}\{(2n+1) - B - \theta\} - \frac{0.01}{H} - T_{ex}$$

$T_{ex}$ in the formula (10) represents a time elapsed for the temperature change at the first measurement point P1 to be reflected on the temperature change at the second measurement point P2. The left side of the formula (10) is the time at which the state B in FIG. 7 is reached and the right side is the time at which the state D is reached. Through the above process, the horizontal magnetic field of 0.01 tesla is applied to the silicon melt 9 at the first timing from the state B through the state C to the state D, and subsequently the magnetic field intensity is raised to 0.2 tesla, thus fixing the convection flow 90 clockwise.

Then, the pull-up controller 20B performs a process of judging whether the direction of the convection flow 90 is fixed (Step S5). As in the first measurement point P1, the temperature at the second measurement point P2 is stabilized when the direction of the convection flow 90 is fixed. Accordingly, the pull-up controller 20B performs the process of Step S5 depending on whether the temperature at the second measurement point P2 is stabilized.

Subsequently, the pull-up controller 20B pulls up the monocrystalline silicon 10 whose straight body has the desired oxygen concentration based on the predetermined conditions (Step S6).

The processes of Steps S1 to S2, S13, and S4 to S6 described above correspond to the method of manufacturing monocrystalline silicon of the invention, and the processes of Steps S1 to S2, S13, and S4 correspond to the method of controlling the convection pattern of the silicon melt of the invention.

It should be noted that the processes in Steps S13, S4, S5, and S6 may be performed through an operation by an operator as in the first exemplary embodiment.

When it is hoped that the convection flow 90 should be fixed anticlockwise in the first thermal environment or the convection flow 90 should be fixed anticlockwise in the second thermal environment, the drive of the magnetic-field applying portion 14 may be started at a timing at which a time $t_{\beta 2}$ satisfies a formula (11) below whose phase is shifted by 180 degrees with respect to the phase of the formula (10).

Numerical Formula 11

$$\frac{1}{\omega}\{2n\pi - B - \theta\} - \frac{0.01}{H} - T_{ex} < \quad (11)$$
$$t_{\beta 2} < \frac{1}{\omega}\{(2n+1) - B - \theta\} - \frac{0.01}{H} - T_{ex}$$

[7] Operations and Effects in Second Exemplary Embodiment

The second exemplary embodiment as described above can provide the following operations and effects in addition to the same operations and effects in the first exemplary embodiment.

The direction of the convection flow can be fixed also by estimating the temperature at the first measurement point P1 of the silicon melt 9 based on the temperature at the second measurement point P2 on the furnace wall of the chamber 2. Further, the direction of the convection flow can be fixed through a simple process of installing the radiation thermometer 15B on an outside of the chamber 2.

The use of the formula (10), which takes into account the time after starting the application of the horizontal magnetic field until the 0.01 tesla magnetic field is applied to the silicon melt 9 and the time elapsed for the temperature change at the first measurement point P1 to be reflected to the temperature change at the second measurement point P2, allows the direction of the convection flow to be more accurately fixed.

[8] Modification(s)

It should be understood that the scope of the invention is not limited by the above exemplary embodiments, but various improvements and design modifications compatible with the invention are possible.

For instance, in the first exemplary embodiment, the convection flow 90 may be fixed clockwise by, without using the formula (8), determining, for instance, the first timing during which the temperature of the surface 9A of the silicon melt 9 shifts from the state B through the state C to the state D based on the periodic temperature change at the first measurement point P1, and controlling the magnetic-field applying portion 14 so that the 0.01-tesla horizontal magnetic field is applied to the silicon melt 9 at the first timing ("first modification" hereinafter).

In the second exemplary embodiment, the convection flow 90 may be fixed clockwise, without using the formula (10), by estimating the change at the first measurement point P1 on the surface 9A of the silicon melt 9 based on the periodic temperature change at the second measurement point P2 and controlling the magnetic-field applying portion 14 in the same manner as the first modification.

In the process of Step S5 in the first and second exemplary embodiments, it is judged whether the direction of the convection flow 90 is fixed based on the temperature change at the first and second measurement points P1, P2. However, in some embodiments, it is checked in advance how many minutes have elapsed until the direction of the convection flow 90 is fixed after starting the application of the horizontal magnetic field, and it is judged whether the direction of the convection flow 90 is fixed based on the elapsed time after the application of the horizontal magnetic field.

In the second exemplary embodiment, the second measurement point may be defined on a component installed in the chamber 2. Specifically, as shown in a chain double-dashed line in FIG. 10, the temperature of the second measurement point P2, which is located on an outer circumferential surface of the heater 5, may be measured by the radiation thermometer 15B through an opening 2B provided in the heat insulation material 6 and the furnace wall. Alternatively, the temperature of the second measurement point P2, which is located on an outer circumferential surface of the heat shield 11, is measured by the radiation thermometer 15B through a quartz window 2A provided in the chamber 2 in some embodiments. It should be noted that the second measurement point P2, which is provided on the outer circumferential surface of the heater 5 or the heat shield 11 in some embodiments, is also located on the second imaginary line 9H as shown in FIG. 11 as well as the first measurement point P1.

In these cases, the length of $T_{ex}$ in the formulae (10), (11) is preferably set at a value different from that in the second exemplary embodiment depending on the distance between the first measurement point P1 and the second measurement point P2, presence of a component(s) between the first and second measurement points, and the like.

Although the plane viewed from the second magnetic body 14B (the near side of the sheet of FIG. 1) is exemplarily shown as the field-orthogonal cross-section, a plane viewed from the first magnetic body 14A (the far side of the sheet of FIG. 1 (the positive direction of the Y axis in FIG. 2)) may be defined as the field-orthogonal cross-section for defining the direction of the convection flow 90.

EXAMPLE(S)

Next, Examples of the invention will be described. It should be noted that the invention is by no means limited to Examples.

Experiment 1: Determination of Relationship Between Temperature Change of Silicon Melt and Application Condition of Horizontal Magnetic Field With the use of the pull-up device 1 shown in FIG. 1, the silicon melt 9 was produced from 400 kg polycrystalline silicon material and the quartz crucible 3A was rotated anticlockwise as viewed from above. Then, after an elapse of a predetermined time after the temperatures at the first to third measurement points Q1 to Q3 shown in FIG. 7 began to periodically change, the magnetic-field applying portion 14 was driven at a time $t_1$ to start applying the horizontal magnetic field on the silicon melt 9. The increase rate of magnetic-field intensity H at the start of applying the horizontal magnetic field was 0.00025 tesla/sec. (0.015 tesla/min.). The magnetic field intensity was kept being raised until the intensity of the magnetic field applied to the silicon melt 9 reached 0.3 tesla.

The relationship between the measurement results of the temperature at each of the first to third measurement points Q1 to Q3 and the application condition of the horizontal magnetic field is shown in FIG. 12. It should be noted that the interval between adjacent two graduations in the abscissa axis in FIG. 12 represents 600 seconds.

As shown in FIG. 12, the cycles of the respective temperature changes at the first to third measurement points Q1 to Q3 were the same (approximately 580 seconds). The phases of the cycles of the temperature changes were each shifted by 90 degrees.

The temperatures at the first to third measurement points Q1 to Q3 were periodically changed until a time $t_2$ when the magnetic field intensity applied to the silicon melt 9 reached 0.01 tesla. However, the periodicity was gradually lost after the time $t_2$ and, after the magnetic field intensity exceeded 0.2 tesla and the silicon melt 9 was left still for some time, the state of the silicon melt was stabilized with the temperatures at the first and third measurement points Q1, Q3 being higher than the temperature at the second measurement point Q2.

It is speculated that the convection flow 90 of the silicon melt 9 was fixed anticlockwise based on the above temperature relationship.

From the above, it was confirmed that the rotation of the downward flow was restricted when the horizontal magnetic field of 0.01 tesla was applied to the silicon melt 9, and, subsequently, when the magnetic field intensity was raised to 0.2 tesla or more, the convection flow 90 of the silicon melt 9 was fixed clockwise or anticlockwise.

Experiment 2: Determination of Relationship between Application Timing of Horizontal Magnetic Field and Fixed Direction of Convection Flow With the use of the same pull-up device 1 as used in the above Experiment 1, the silicon melt 9 was produced from 400 kg polycrystalline silicon material and the quartz crucible 3A was rotated anticlockwise as viewed from above. Then, after an elapse of a predetermined time after the temperatures at the first to third measurement points Q1 to Q3 shown in FIG. 7 began to periodically change, the magnetic-field applying portion 14 was driven at a predetermined timing. The direction of the convection flow 90 of the silicon melt 9 was estimated based on a temperature difference between the second and third measurement points Q2, Q3 after the horizontal magnetic field was applied to the silicon melt 9 and the temperatures at the first to third measurement points Q1 to Q3 were stabilized.

The magnetic-field applying portion 14 was driven at each of timings A, A/B, B, B/C, C, C/D, D, and D/A shown in FIG. 13. The temperature change at the first measurement point P1 was fitted by the formula (1). Then, the timing A was determined at a time at which the phase (ωt+B) when the horizontal magnetic field applied to the silicon melt 9 became 0.01 tesla was 0 degrees, and timings A/B, B, B/C, C, C/D, D, and D/A were determined when the phase was 45 degrees, 90 degrees, 135 degrees, 180 degrees, 225 degrees, 270 degrees, and 315 degrees, respectively.

The temperature of the surface 9A of the silicon melt 9 reached the state A shown in FIG. 7 (shown as "A" in FIG. 13) at the timing A, and became the state B, the state C, and the state D at the timings B, C, and D, respectively. Further, at the timing A/B, the temperature of the surface 9A reached an intermediate state between the states A and B, and reached an intermediate state between the states B and C, an intermediate state between the states C and D, and an intermediate state between the state D and A, at the timings B/C, C/D, and D/A, respectively.

Experiments for applying the horizontal magnetic field, whose magnetic field intensity reached 0.01 tesla at each of the timings A, A/B, B, B/C, C, C/D, D, and D/A and was subsequently raised to 0.3 tesla, were conducted four times at each of the timings A, A/B, B, B/C, C, C/D, D, and D/A. The estimation results of the fixed direction of the convection flow 90 at each of the timings are shown in Table 4.

It should be noted that, when the temperature at the second measurement point Q2 was higher than the temperature at the third measurement point Q3, it was estimated that the convection flow 90 of the silicon melt 9 was fixed clockwise. In contrast, when the temperature at the second measurement point Q2 was lower than the temperature at the third measurement point Q3, it was estimated that the convection flow 90 was fixed anticlockwise.

As shown in Table 4, when the horizontal magnetic field of 0.01 tesla was applied to the silicon melt 9 at the timing A, A/B, or D/A (i.e. at the second timing from the state D through the state A until reaching the state B), the direction of the convection flow 90 was fixed anticlockwise with a probability of 100%. Meanwhile, when the horizontal magnetic field of 0.01 tesla was applied at the timing B, B/C, or C/D (i.e. at the first timing from the state B through the state C until reaching the state D), the direction of the convection flow 90 was fixed clockwise with a probability of 100%.

In contrast, when the horizontal magnetic field of 0.01 tesla was applied at the timing D (i.e. in the state D), the direction of the convection flow 90 was fixed anticlockwise at a probability of 50%. When the horizontal magnetic field of 0.01 tesla was applied at the timing B (i.e. in the state B), the direction of the convection flow 90 was fixed clockwise with a probability of 75%.

From the above, it was confirmed that the direction of the convection flow 90 can be securely fixed clockwise or anticlockwise by applying the horizontal magnetic field of 0.01 tesla to the silicon melt 9 at the first timing or the second timing except for the state B or the state D.

TABLE 4

| | Phase ($\omega t + B$) | Clockwise convection flow | Anticlockwise convection flow |
|---|---|---|---|
| Timing A | 0° | 0% | 100% |
| Timing A/B | 45° | 0% | 100% |
| Timing B | 90° | 75% | 25% |
| Timing B/C | 135° | 100% | 0% |
| Timing C | 180° | 100% | 0% |
| Timing C/D | 225° | 100% | 0% |
| Timing D | 270° | 50% | 50% |
| Timing D/A | 315° | 0% | 100% |

EXPLANATION OF CODE(S)

1 . . . pull-up device, 2 . . . chamber, 3A . . . quartz crucible, 8 . . . seed crystal, 9 . . . silicon melt, 9F . . . first imaginary line, 9G, 9H . . . second imaginary line, 10 . . . monocrystalline silicon, 14 . . . magnetic-field applying portion, 14C . . . magnetic field line, 90 . . . convection flow, P1, P2 . . . first and second measurement points.

The invention claimed is:

1. A method of controlling a convection pattern of a silicon melt used for manufacturing monocrystalline silicon, the method comprising:
    acquiring a temperature at a first measurement point on a surface of a silicon melt in a quartz crucible rotating in a magnetic-field-free state, the first measurement point not overlapping a rotation center of the quartz crucible;
    determining that the temperature at the first measurement point is periodically changed; and
    at a timing when a temperature change at the first measurement point reaches a predetermined state, starting a drive of a magnetic-field applying portion to apply a horizontal magnetic field to the silicon melt, and subsequently raising the intensity to 0.2 tesla or more to fix a direction of a convection flow in a plane orthogonal to an application direction of the horizontal magnetic field in the silicon melt to a single direction.

2. The method according to claim 1, wherein
the first measurement point is located at a position for a central part of a downward flow to pass through on the surface of the silicon melt rotating in the same direction as a rotation of the quartz crucible.

3. The method according to claim 1, wherein
the timing for the temperature change at the first measurement point to reach the predetermined state is a first timing where the central part of the downward flow on the surface of the silicon melt is in a region of X>0 or a second timing where the central part of the downward flow on the surface of the silicon melt is in a region of X<0, the X being defined as an X axis in a right-handed XYZ orthogonal coordinate system whose origin is defined by a center of the surface of the silicon melt, a positive direction of a Z axis is defined by a vertically upward direction, and a positive direction of a Y axis is defined by the application direction of the horizontal magnetic field, and in the fixing of the direction of the convection flow to the single direction, as viewed in a negative direction of the Y axis, the direction of the convection flow is fixed clockwise when the timing for the temperature change reaches the predetermined state is the first timing, and the direction of the convection flow is fixed anticlockwise when the timing for the temperature change reaches the predetermined state is the second timing.

4. The method according to claim 2, wherein
in the fixing of the direction of the convection flow in the single direction, the magnetic-field applying portion configured to apply the horizontal magnetic field is started being driven at a time $t_\alpha$ satisfying a formula (2) below after the temperature change at the first measurement point reaches a state represented by a periodic function represented by a formula (1) below, where:

T(t) represents a temperature at the first measurement point at a time t;

$\omega$ represents an angular frequency;

A represents an amplitude of a vibration;

B represents a phase of the vibration when the time t is 0;

C represents a term representing a component other than the vibration;

n represents an integer;

θ, which is defined in a right-handed XYZ orthogonal coordinate system whose origin is defined by a center of the surface of the silicon melt, a positive direction of a Z axis is defined by a vertically upward direction, and a positive direction of a Y axis is defined by the application direction of the horizontal magnetic field, represents a positive angle defined by a first imaginary line and a second imaginary line, the first imaginary line being defined by a line extending from the origin in a positive direction of an X axis, the second imaginary line being defined by a line passing through the origin and the first measurement point, the positive angle being defined by an angle in a rotation direction of the quartz crucible; and H represents an increase rate (tesla/second) of the intensity of the horizontal magnetic field at the start of applying the horizontal magnetic field, $$T(t) = A \sin(\omega t + B) + C \qquad (1)$$

$$\frac{1}{\omega}\{2n\pi - B - \theta\} - \frac{0.01}{H} < t_\alpha < \frac{1}{\omega}\{(2n+1)\pi - B - \theta\} - \frac{0.01}{H}. \qquad (2)$$

5. The method according to claim 1, wherein
in the acquiring of the temperature at the first measurement point, a temperature of a second measurement point on a chamber of a pull-up device or a component disposed in the chamber is measured with a thermometer, based on measurement results of which the temperature at the first measurement point is estimated.

6. The method according to claim 5, wherein
in the fixing of the direction of the convection flow in the single direction, the magnetic-field applying portion configured to apply the horizontal magnetic field is started being driven at a time $t_\beta$ satisfying a formula (4) below after the temperature change at the second measurement point reaches a state represented by a periodic function represented by a formula (3) below, where:

T(t) represents a temperature at the second measurement point at a time t;

ω represents an angular frequency;

A represents an amplitude of a vibration;

B represents a phase of the vibration when the time t is 0;

C represents a term representing a component other than the vibration;

n represents an integer;

θ, which is defined in the right-handed XYZ orthogonal coordinate system where the origin is defined by the center of the surface of the silicon melt, the positive direction of the Z axis is defined by the vertically upward direction, and the positive direction of the Y axis is defined by the application direction of the horizontal magnetic field, represents a positive angle defined by a first imaginary line and a second imaginary line, the first imaginary line being defined by a line extending from the origin in the positive direction of the X axis, the second imaginary line being defined by a line passing through the origin and the second measurement point, the positive angle being defined by an angle in a rotation direction of the quartz crucible;

H represents an increase rate (tesla/second) of the intensity of the horizontal magnetic field at the start of applying the horizontal magnetic field, and $T_{ex}$: represents a time elapsed for the temperature change at the first measurement point located on the second imaginary line to be reflected on the temperature change at the second measurement point, $$T(t) = A\ \sin(\omega t + B) + C \qquad (3)$$

$$\frac{1}{\omega}\{2n\pi - B - \theta\} - \frac{0.01}{H} - T_{ex} < \qquad (4)$$
$$t_\beta < \frac{1}{\omega}\{(2n+1)\pi - B - \theta\} - \frac{0.01}{H} - T_{ex}.$$

7. A manufacturing method of monocrystalline silicon, comprising:
conducting the method of controlling the convection pattern of the silicon melt according to claim 1; and
pulling up the monocrystalline silicon while the intensity of the horizontal magnetic field is kept at 0.2 tesla or more.

8. The manufacturing method of monocrystalline silicon according to claim 7, wherein
the monocrystalline silicon is pulled up after conducting the method of controlling the convection pattern of the silicon melt and confirming that the direction of the convection flow is fixed.

* * * * *